(12) United States Patent
Forbes et al.

(10) Patent No.: US 6,219,299 B1
(45) Date of Patent: Apr. 17, 2001

(54) PROGRAMMABLE MEMORY DECODE CIRCUITS WITH TRANSISTORS WITH VERTICAL GATES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/584,564

(22) Filed: May 31, 2000

(51) Int. Cl.$^7$ ................................................. G11C 8/00

(52) U.S. Cl. ................... 365/230.06; 365/200; 257/302; 257/315

(58) Field of Search ............................... 365/230.06, 200, 365/185.1, 185.05; 257/302, 315, 316, 317

(56) References Cited

U.S. PATENT DOCUMENTS

| | | | |
|---|---|---|---|
| 4,051,354 | 9/1977 | Choate | 235/312 |
| 4,673,962 | * 6/1987 | Chatterjee et al. | 257/68 |
| 4,962,327 | * 10/1990 | Iwazari | 365/230.06 |
| 5,327,380 | 7/1994 | Kersh, III et al. | 365/195 |
| 5,386,132 | * 1/1995 | Wong | 257/316 |
| 5,583,360 | * 12/1996 | Roth et al. | 257/316 |
| 5,661,055 | 8/1997 | Hsu et al. | 438/259 |
| 5,847,425 | * 12/1998 | Yuan et al. | 257/315 |
| 5,991,225 | * 11/1999 | Forbes et al. | 365/232.06 |

OTHER PUBLICATIONS

"Frequently–Asked Questions (FAQ) About Programmable Logic", *Optimagic, Inc.*, http://www.optimagic.com/Faq.html, pp. 1–18, (1997).

Chen, W., et al., "Very uniform and high aspect ratio anisotrophy SI02 etching process in magnetic neutral loop discharge plasma", *J. Vac. Sci. Technol. A , 17(5)*, pp. 2546–2550, (1999).

Dipert, B., et al., "Flash Memory Goes Mainstream", *IEEE Spectrum , 30*, 48–52, (Oct. 1993).

Hodges, D.A. et al., *Analysis and Design of Digital Integrated Circuits*, McGraw–Hill Book Company, 2nd Edition, 394–396, (1988).

Hodges, D.A., et al., *Analysis and Design of Digital Integrated Circuits, 2nd Edition*, McGraw–Hill Publishing. New York, pp. 354–357, (1988).

(List continued on next page.)

*Primary Examiner*—Tan T. Nguyen
(74) *Attorney, Agent, or Firm*—Schwegman, Lundberg, Woessner & Kluth, P.A.

(57) ABSTRACT

Structures and methods for programmable memory decode circuits are provided with logic cells, or floating gate transistors, which can operate with lower applied control gate voltages than conventional memory decode circuits. The programmable logic arrays of the present invention do not increase the costs or complexity of the fabrication process. According to the teachings of the present invention, the floating gate capacitance in the logic cells is much smaller than the control gate capacitance such that the majority of any voltage applied to the control gate will appear across the floating gate thin tunnel oxide. The memory decode circuits include a number of address lines and a number of output lines such that the address lines, and the output lines form an array. A number logic cells are disposed at the intersections of output lines and address lines. A number of non volatile memory cells are disposed at the intersections of the address lines and at least one redundant output line. The number of non volatile memory cells include a source region, a drain region, and channel region separating the source and the drain regions in a horizontal substrate. A first vertical gate is located above a portion of the channel region and separated from the channel region by a first thickness insulator material. A second vertical gate is located above another portion of the channel region and separated therefrom by a second thickness insulator material.

92 Claims, 12 Drawing Sheets

OTHER PUBLICATIONS

Johnson, J., et al., "IBM's 0.5 micrometer Embedded Flash Memory Technology", *MicroNews, 4(3)*, http://www.chips.ibm.com/micronews/vol14_No. 3/flash.html, pp. 1–7, (1998).

Landheer, D., et al., "Formation of high–quality silicon dioxide films by electron cyclotron resonance plasma oxidation and plasma–enhanced chemical vapour deposition", *Thin Solid Films, 293*, pp. 52–62, (1997).

Moore, W.R., "A Review of Fault–Tolerant Techniques for the Enhancement of Integrated Ccircuit Yield", *Proceedings fo the IEEE*, 74(5), 684–698, (May 1986).

Nozawa, R., et al., "Low temperature polycrystalline silicon film formation with and without charged species in an electron cyclotron resonances SiH4/H2 plasma–enhanced chemical vapor deposition", *J. Vac. Sci. Technol. A, 17(5)*, pp. 2542–2545, (1999).

Patel, P., et al., "Low temperature VUV enhanced growth of thin silicon dioxide films", *Applied Surface Science, 46*, pp. 352–356, (1990).

Rueger, N.R., et al., "Selective etching of SiO2 over polycrystalline silicon using CHF3 in an inductively coupled plasma", *J. Vac. Sci. Technol. A, 17(5)*, pp. 2492–2502, (1999).

Shindo, W., et al., "Low–temperature large–gain poly–Si direct deposition by microwave plasma enhanced chemical vapor disposition using SiH4/Xe", *J. Vac. Sci. Technol. A, 17(5)*, pp. 3134–3138, (1999).

Usami, K., et al., "Thin Si oxide films for MIS tunnel emitter by hollow cathode enhanced plasma", *Thin Films, 281–282*, pp. 412–414, (1996).

Vallon, S., et al., "Polysilicon–germanium gate patterning studies in a high density plasma helicon source", *J. Vac. Sci. Technol. A, 15(4)*, pp. 1874–1880, (1997).

* cited by examiner

PROGRAMMABLE MEMORY DECODE CIRCUITS WITH TRANSISTORS WITH VERTICAL GATES

CROSS REFERENCE TO RELATED APPLICATIONS

This application is related to the following co-pending, commonly assigned U.S. patent applications: "Horizontal Memory Devices with Vertical Gates," Ser. No. 09/584,566, and "Programmable Logic Arrays with Transistors with Vertical Gates," Ser. No. 09/583,584, which are filed on even date herewith and each of which disclosure is herein incorporated by reference.

TECHNICAL FIELD OF THE INVENTION

This invention relates generally to integrated circuits and in particular to programmable memory address and decode circuits with transistors having vertical gates.

BACKGROUND OF THE INVENTION

One difficulty with memory address and decode circuit transistors is the one time programmability of the metal oxide semiconductor field effect transistors (MOSFETs) used in such a conventional array. Another difficulty is that when floating gate transistors are used to afford in the field, or in service programmability to the array such floating gate transistors generally require high operating and high programming voltages which are not well suited to low power applications. These floating gate transistors can be EEPROM, EAPROM, and flash memory cell types. One reason for the high operating and high programming voltage requirements in these floating gate transistors is the adverse capacitance ratio between the control gate and the floating gate. In other words, the capacitance between the control gate to floating gate (CCG) is about the same as the floating gate to substrate capacitance (CFG). FIG. 1A is an illustration of a horizontal EEPROM, EAPROM, or flash memory device formed according to the teachings of the prior art. As shown in FIG. 1A, conventional horizontal floating gate transistor structures include a source region 110 and a drain region 112 separated by a channel region 106 in a horizontal substrate 100. A floating gate 104 is separated by a thin tunnel gate oxide 105 shown with a thickness (t1). A control gate 102 is separated from the floating gate 104 by an intergate dielectric 103 shown with a thickness (t2). Such conventional devices must by necessity have a control gate 102 and a floating gate 104 which are about the same size in width.

FIG. 1B is an illustration of a vertical EEPROM, EAPROM, or flash memory device formed according to the disclosure in a co-pending, commonly assigned application by W. Noble and L. Forbes, entitled "Field programmable logic array with vertical transistors," Ser. No. 09/032,617, filed Feb. 27, 1998. FIG. 1B illustrates that vertical floating gate transistor structures have a stacked source region 110 and drain region 112 separated by a vertical channel region 106. The vertical floating gate transistor shown in FIG. 1B further includes a vertical floating gate 104 separated by a thin tunnel gate oxide 105 from the channel region 106. A vertical control gate 102 is separated from the floating gate 104 by an intergate dielectric 103. As shown in FIG. 1B, the vertical control gate 102 and the vertical floating gate 104 are likewise about the same size in width relative to the channel region 106.

Conventionally, the insulator, or intergate dielectric, 103 between the control gate 102 and the floating gate 104 is thicker (t2) than the gate oxide 105 (t1) to avoid tunnel current between the gates. The insulator, or intergate dielectric, 103 is also generally made of a higher dielectric constant insulator 103, such as silicon nitride or silicon oxynitride. This greater insulator thickness (t2) tends to reduce capacitance. The higher dielectric constant insulator 103, on the other hand, increases capacitance. As shown in FIG. 1C, the net result is that the capacitance between the control gate and the floating gate (CCG) is about the same as the gate capacitance of the thinner gate tunneling oxide 105 between the floating gate and the substrate (CFG). This undesirably results in large control gate voltages being required for tunneling, since the floating gate potential will be only about one half that applied to the control gate.

As design rules and feature size (F) in floating gate transistors continue to shrink, the available chip surface space in which to fabricate the floating gate also is reduced. In order to achieve a higher capacitance between the control gate and floating gate (CCG) some devices have used even higher dielectric constant insulators between the control gate and floating gate. Unfortunately, using such higher dielectric constant insulators involves added costs and complexity to the fabrication process.

Therefore, there is a need in the art to provide field programmable memory address and decode circuits which can operate with lower control gate voltages and which do not increase the costs or complexity of the fabrication process. Further such devices should desirably be able to scale with shrinking design rules and feature sizes in order to provide even higher density integrated circuits.

SUMMARY OF THE INVENTION

The above mentioned problems with field programmable memory address and decode circuits and other problems are addressed by the present invention and will be understood by reading and studying the following specification. Structures and methods for field programmable memory address and decode circuits are provided with logic cells, or floating gate transistors, which can operate with lower applied control gate voltages than conventional field programmable memory address and decode circuits. The field programmable memory address and decode circuits of the present invention do not increase the costs or complexity of the fabrication process. These circuits and methods are fully scalable with shrinking design rules and feature sizes in order to provide even higher density integrated circuits. The total capacitance of the logic cells within the field programmable memory address and decode circuits is about the same as that for the prior art of comparable source and drain spacings. However, according to the teachings of the present invention, the floating gate capacitance in the logic cells is much smaller than the control gate capacitance such that the majority of any voltage applied to the control gate will appear across the floating gate thin tunnel oxide. Thus, the logic cells in the programmable memory address and decode circuits of the present invention can be programmed by tunneling of electrons to and from the silicon substrate at lower control gate voltages than is possible in the prior art.

In one embodiment of the present invention an address decoder for a memory device is provided. The address decoder includes a number of address lines and a number of output lines. The address lines and the output lines form an array. A number logic cells that are disposed at the intersections of output lines and address lines. Further, a number of non volatile memory cells are disposed at the intersections of the address lines and at least one output line. In one embodiment, the at least one output line includes a redundant output line. According to the teachings of the present invention, the number of non volatile memory cells include a source region, a drain region, and a channel region separating the source and the drain regions in a horizontal substrate. A first vertical gate is located above a portion of the channel region and separated from the channel region by a first thickness insulator material. A second vertical gate is located above another portion of the channel region and separated therefrom by a second thickness insulator material. The second vertical gate opposes the first vertical gate, and is separated from the first vertical gate by an intergate dielectric.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE INVENTION

Figure 1A:
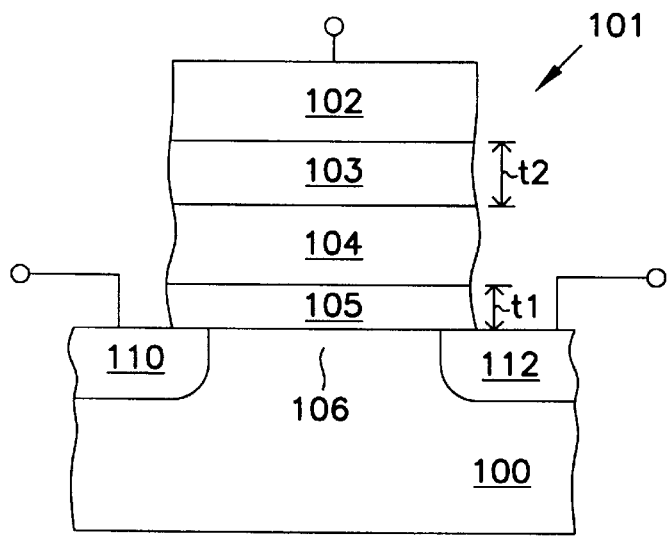
FIG. 1A is an illustration of a horizontal EEPROM, EAPROM, or flash memory device formed according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 2A:
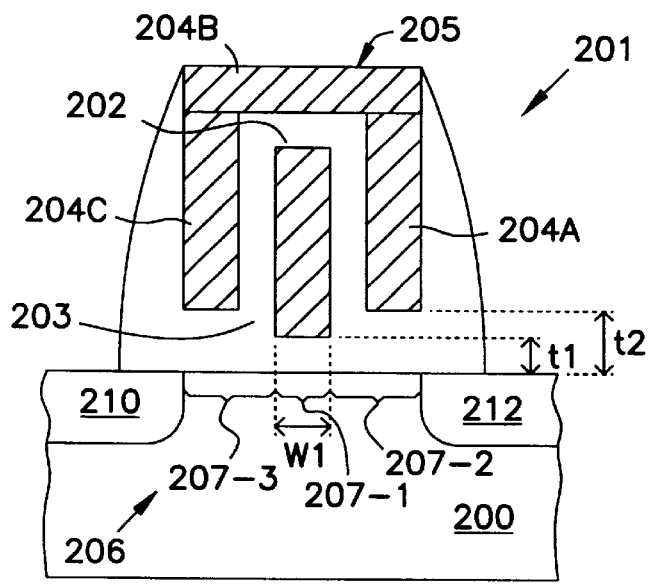
FIG. 2A is a block diagram of an embodiment for a novel memory cell, transistor, or floating gate transistor formed according to the teachings of the present invention.

FIG. 2A is a block diagram of an embodiment for a novel memory cell, transistor, or floating gate transistor 201 formed according to the teachings of the present invention. As shown in FIG. 2A, the memory cell 201 includes a source region 210 and a drain region 212 separated by a channel region 206 in a horizontal substrate 200. According to the teachings of the embodiment shown in FIG. 2A, the memory cell 201 includes a first vertical gate 202 located above a first portion, or first region, 207-1, of the channel region 206. In one embodiment, the first vertical gate 202 includes or serves as a floating gate 202 for the memory cell 201. In an alternative embodiment, the first vertical gate 202 includes or serves as a control gate 202 for memory cell 201. The first vertical gate is separated from the channel region 206 by a first thickness insulator material, or first oxide thickness (t1). A second vertical gate 204A is located above a second portion, or second region, 207-2 of the channel region 206. The second vertical gate 204A is separated from the channel region 206 by a second thickness insulator material, or second oxide thickness (t2). The memory cell 201 embodiment shown in FIG. 2A further includes a third vertical gate 204C located above a third portion, or third region, 207-3 of the channel region 206. The third vertical gate is separated from the channel region 206 by the second thickness insulator material, or second oxide thickness (t2). In one embodiment of the present invention, the first oxide thickness (t1) is approximately 60 Angstroms (Å) and the second oxide thickness (t2) is approximately 100 Angstroms (Å). According to the teachings of the present invention, the first thickness insulator material (t1) and the second thickness insulator material (t2) are formed of silicon dioxide ($SiO_2$).

As shown in the embodiment of FIG. 2A, the second and the third vertical gates, 204A and 204C respectively, are parallel to and on opposing sides of the first vertical gate 202 forming a symmetrical structure. The memory cell 201 embodiment of FIG. 2A further includes a horizontal gate member 204B which couples the second 204A and the third 204C vertical gates. The horizontal gate member 204B is located above the first vertical gate 202 and separated therefrom by an intergate dielectric 203. In the embodiment shown in FIG. 2A, the second and the third portion, 207-2 and 207-3 respectively, of the channel region 206 are adjacent to the source region 210 and the drain region 212 respectively.

According to one embodiment of the present invention, the first vertical gate 202, the second vertical gate 204A, the horizontal gate member 204B, and the third vertical gate 204C include polysilicon gates which are separated from one another by the intergate dielectric 203. According to the teachings of the present invention, the intergate dielectric includes an intergate dielectric formed from silicon dioxide ($SiO_2$). In one embodiment, the intergate dielectric 203 between the first vertical gate 202, the second vertical gate 204A, the horizontal gate member 204B, and the third vertical gate 204C has a thickness approximately equal to the first oxide thickness (t1), or first thickness insulator material. In one embodiment of the present invention, the first vertical gate 202, the second vertical gate 204A, and the third vertical gate 204C each have a horizontal width of approximately 100 nanometers (nm).

As described above, in one embodiment, the first vertical gate 202 in memory cell 201 serves as a floating gate 202. In this embodiment, the second vertical gate 204A, the horizontal gate member 204B, and the third vertical gate 204C serve as control gates. In an alternative embodiment, the first vertical gate 202 in memory cell 201 serves as a control gate for the memory cell 201. In this embodiment, the second vertical gate 204A, the horizontal gate member 204B, and the third vertical gate 204C serve as floating gates. In one embodiment, the first vertical gate 202, the second vertical gate 204A, and the third vertical gate 204C have a vertical height, respectively, of approximately 500 nanometers (nm).

Figure 2B:
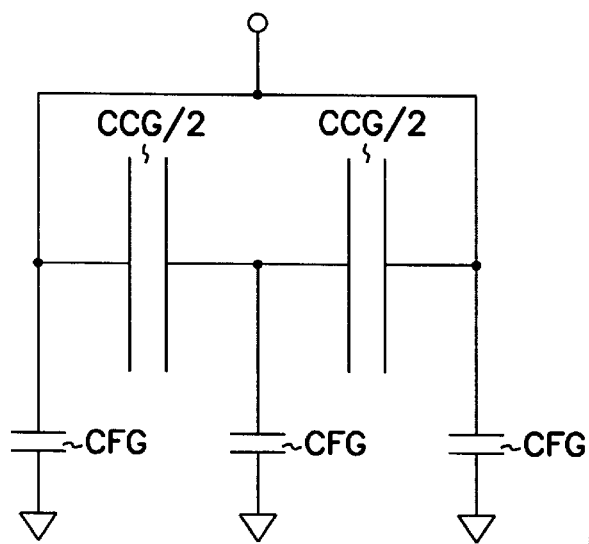
FIG. 2B is a schematic diagram illustrating the respective capacitances between the between respective components of the novel memory cell shown in FIG. 2A.
Figure 2C:
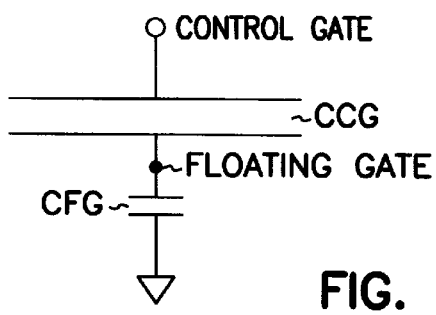
FIG. 2C is a simplified schematic diagram representing the same capacitance relationship shown in FIG. 2B.

FIG. 2B is a schematic diagram illustrating the respective capacitances between the between the first vertical gate 202, the second vertical gate 204A, the horizontal gate member 204B, and the third vertical gate 204C, e.g. the control gate capacitance (CCG), as well as between these vertical gates and the channel region 206, e.g. the floating gate capacitance (CFG). FIG. 2C is a simplified schematic diagram representing the same capacitance relationship. Thus, according to the teachings of the present invention, a greater percentage of a voltage applied to the control gate appears between the floating gate and the channel than between the control gate and the floating gate. This is true, since as shown in FIGS. 2B and 2C, the floating gate capacitance (CFG) of the present invention is much smaller than the control gate capacitance (CCG).

According to the teachings of the present invention, the total capacitance of these memory devices is about the same as that for the prior art of comparable source and drain spacings. However, according to the teachings of the present invention, the floating gate capacitance is much smaller than the control gate capacitance such that the majority of any voltage applied to the control gate will appear across the floating gate thin tunnel oxide. Thus, the devices of the present invention can be programmed by tunneling of electrons to and from the silicon substrate at lower control gate voltages than is possible in the prior art.

Figure 3A:
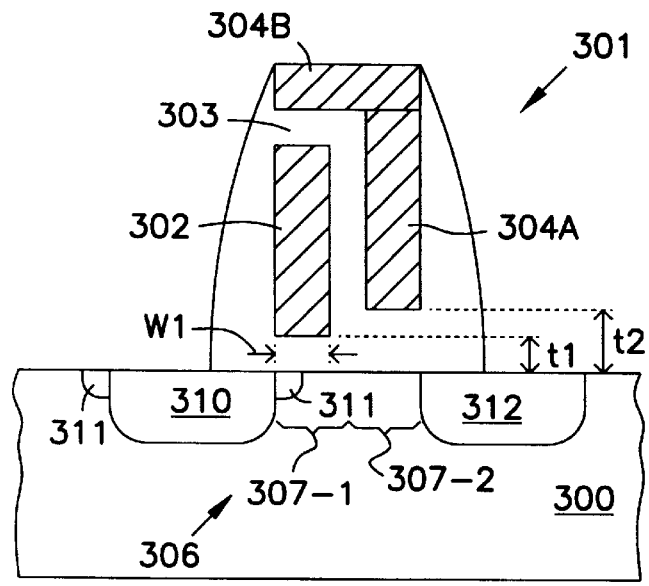
FIG. 3A is a block diagram of another, asymmetrical embodiment for a novel memory cell, transistor, or floating gate transistor formed according to the teachings of the present invention.

FIG. 3A is a block diagram of another, asymmetrical embodiment for a novel memory cell, transistor, or floating gate transistor 301 formed according to the teachings of the present invention. As shown in FIG. 3A, the memory cell 301 includes a source region 310 and a drain region 312 separated by a channel region 306 in a horizontal substrate 300. According to the teachings of the embodiment shown in FIG. 3A, the memory cell 301 includes a first vertical gate 302 located above a first portion, or first region, 307-1, of the channel region 306. In one embodiment, the first vertical gate 302 includes or serves as a vertical floating gate 302 for the memory cell 301. In an alternative embodiment, the first vertical gate 302 includes or serves as a vertical control gate 302 for memory cell 301. The first vertical gate is separated from the channel region 306 by a first thickness insulator material, or first oxide thickness (t1). A second vertical gate 304A is located above a second portion, or second region, 307-2 of the channel region 306. The second vertical gate 304A is parallel to and opposes the first vertical gate 302 and is separated therefrom by an intergate dielectric 303. The second vertical gate 304A is separated from the channel region 306 by a second thickness insulator material, or second oxide thickness (t2). According to the teachings of the present invention, the first thickness insulator material (t1) and the second thickness insulator material (t2) are formed of silicon dioxide ($SiO_2$). In one embodiment, the first thickness insulator material (t1) is approximately 60 Angstroms (Å), and wherein the second thickness insulator material (t2) is approximately 100 Angstroms (Å).

According to one embodiment of the present invention, the second vertical gate 304A includes a horizontal gate member 304B which couples to the second vertical gate 304A and is separated from the first vertical gate by the intergate dielectric 303. As shown in FIG. 3A, the horizontal member 304B is located above a portion of the first vertical gate 302. According to the teachings of the present invention, the intergate dielectric includes an intergate dielectric formed from silicon dioxide ($SiO_2$). In one embodiment, the intergate dielectric 303 between the first vertical gate 302, the second vertical gate 304A, and the horizontal gate member 304B has a thickness approximately equal to the first oxide thickness (t1), or first thickness insulator material. In one embodiment of the present invention, the first vertical gate 302 and the second vertical gate 304A each have a horizontal width of approximately 100 nanometers (nm). In one embodiment, the first vertical gate 302 and the second vertical gate 304A respectively each have a vertical height of approximately 500 nanometers (nm).

As shown in FIG. 3A, the first vertical gate 302 which is separated from a first portion 307-1 of the channel region is separated from a first portion 307-1 of the channel region 306 which includes a portion of the channel region 306 adjacent to the source region 310. The second vertical gate 304A which is separated from a second portion 307-2 of the channel region 306 is separated from a second portion 307-2 of the channel region which includes a portion of the channel region 306 adjacent to the drain region 312. As one of ordinary skill in the art will understand upon reading this disclosure, the relationship of the structure shown in FIG. 3A to the source and drain regions, 310 and 312 respectively, can be reversed. As shown in FIG. 3A, in one embodiment of the present invention, source and/or drain region extension, such as source extension 311, are included in memory cell 301. As will be understood by one of ordinary skill in the art upon reading this disclosure, the same can apply to the memory cell structure shown in FIG. 2A.

Figure 3B:
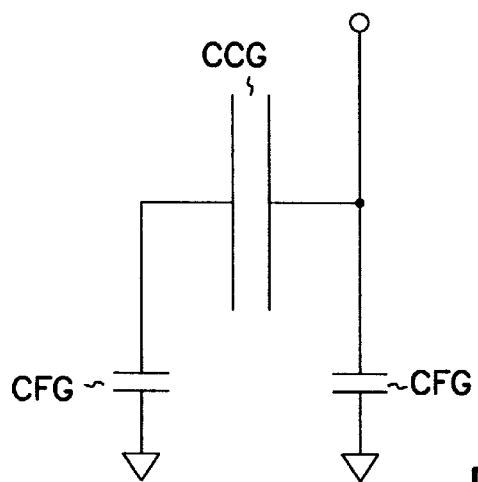
FIG. 3B is a schematic diagram illustrating the respective capacitances between the between respective components of the novel memory cell shown in FIG. 3A.
Figure 3C:
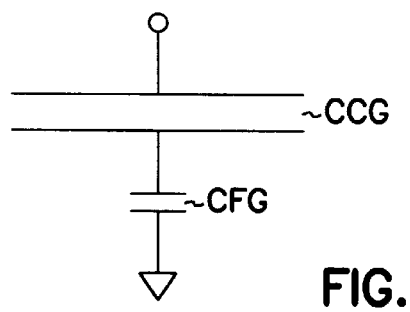
FIG. 3C is a simplified schematic diagram representing the same capacitance relationship shown in FIG. 3B.

FIG. 3B is a schematic diagram illustrating the respective capacitances between the between the first vertical gate 302, the second vertical gate 304A, and the horizontal gate member 304B, e.g. the control gate capacitance (CCG), as well as between these vertical gates and the channel region 306, e.g. the floating gate capacitance (CFG). FIG. 3C is a simplified schematic diagram representing the same capacitance relationship. Thus, according to the teachings of the present invention, a greater percentage of a voltage applied to the control gate appears between the floating gate and the channel than between the control gate and the floating gate. This is true, since as shown in FIGS. 3B and 3C, the floating gate capacitance (CFG) of the present invention is much smaller than the control gate capacitance (CCG). In other words, a capacitance between the vertical control gate 304A and the floating gate 302 (CCG) is greater than a capacitance between the floating gate 302 and the channel 306 (CFG).

Hence again, according to the teachings of the present invention, the total capacitance of these memory devices is about the same as that for the prior art of comparable source and drain spacings. However, according to the teachings of the present invention, the floating gate capacitance is much smaller than the control gate capacitance such that the majority of any voltage applied to the control gate will appear across the floating gate thin tunnel oxide. Thus, the devices of the present invention can be programmed by tunneling of electrons to and from the silicon substrate at lower control gate voltages than is possible in the prior art.

FIGS. 4A–4I are useful in illustrating the methods of forming a novel memory cell, transistor or floating gate transistor according to the teachings of the present invention. According to the teachings of the present invention an edge-defined poly-silicon vertical gate is defined over the thin gate oxide in the active device area. This vertical gate is re-oxidized and another poly-silicon layer is deposited over the structure, and anisotropically or directionally etched to define another polysilicon vertical gate. These can be either symmetrical gate structures as shown and described in connection with FIG. 2A or asymmetrical gate structures as shown and described in connection with FIG. 3A. The methods of the present invention result in a novel memory cell which has a larger capacitance between the control gate and the floating gate, and only a smaller capacitance between the floating gate and the substrate. Thus, according to the teachings of the present invention, smaller control gate voltages than are required by conventional memory devices will result in large potential differences between the floating gate and substrate. This is due to the fact that the capacitance ratio as illustrated in FIGS. 2B, 2C, 3B, and 3C is more advantageous in the novel memory cell embodiments of the present invention.

Figure 4A:
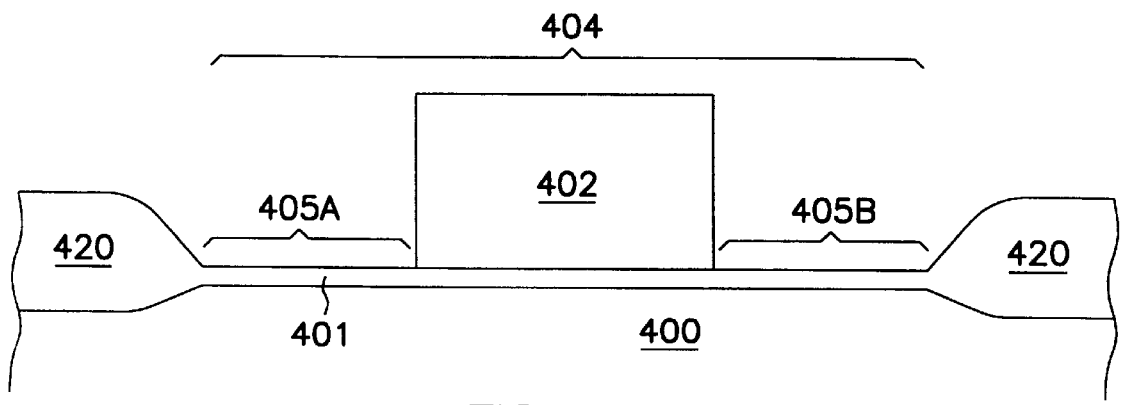
FIGS. 4A–4I illustrate embodiments of the methods for forming the novel memory cell, transistor or floating gate transistor according to the teachings of the present invention.

FIG. 4A illustrates the structure after the first sequence of processing steps. In FIG. 4A, a thin gate oxide 401 is formed over an active device area 404, between a pair of field isolation oxides (FOXs) 420, in a horizontal surface of a substrate 400. The thin gate oxide 401 is formed to a first oxide thickness (t1). In one embodiment, the thin gate oxide 401 is formed to a thickness (t1) of approximately 60 Angstroms (Å). One of ordinary skill in the art will understand upon reading this disclosure the various suitable manners in which a thin gate oxide 401 can be formed over the active device area 403. For example, in one embodiment, the thin gate oxide can be formed by thermal oxidation, and the FOXs can be formed using local oxidation of silicon (LOCOS) as the same are known and understood by one of ordinary skill in the art. After growth of the thin gate oxide 401 by thermal oxidation, and the LOCOS isolation 420, a thick layer of sacrificial oxide 402 is deposited over the surface of the thin gate oxide 401. In one embodiment, the thick layer of sacrificial oxide 402 is deposited to a thickness of approximately 0.5 micrometers ($\mu$m) using a low-pressure chemical vapor deposition (LPCVD) technique. Using a photoresist mask, according to photolithography techniques which are known and understood by one of ordinary skill in the art, this thick oxide 402 is etched. The desired thin-oxide 401 can be regrown in the areas not covered by the remaining thick sacrificial oxide 402. According to one embodiment of the present invention, an inductively coupled plasma reactor (ICP) using $CHF_3$ may be employed for this etching as the same is disclosed in an article by N.R. Rueger et al., entitled "Selective etching of $SiO_2$ over polycrystalline silicon using $CHF_3$ in an inductively couples plasma reactor", J. Vac. Sci. Technol., A, 17(5), p. 2492–2502, 1999. Alternatively, a magnetic neutral loop discharge plasma can be used to etch the thick oxide 402 as disclosed in an article by W. Chen et al., entitled "Very uniform and high aspect ratio anisotropy $SiO_2$ etching process in magnetic neutral loop discharge plasma", ibid, p. 2546–2550. The latter is known to increase the selectivity of $SiO_2$ to photoresist and/or silicon. The structure is now as appears in FIG. 4A.

Figure 4B:
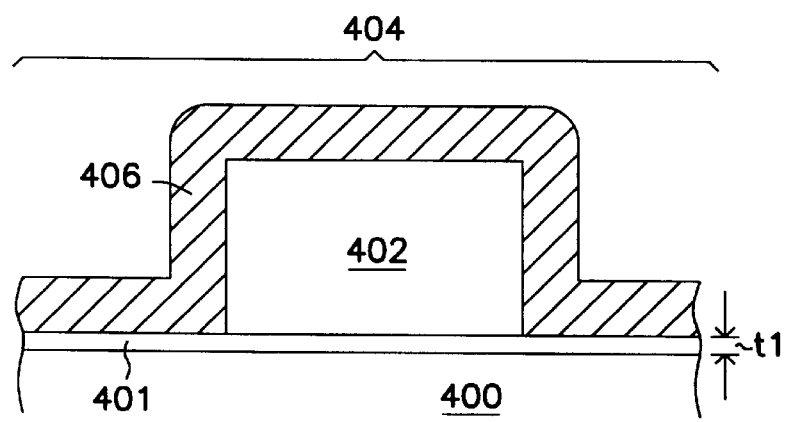

FIG. 4B illustrates the structure following the next sequence of fabrication steps. In FIG. 4B, a polysilicon layer 406 is deposited to a thickness of approximately 200 nanometers (nm). A conventional chemical vapor deposition (CVD) reactor may be used to deposit polycrystalline silicon films at substrate temperature in excess of 650° Celsius (C). In an alternative embodiment, a plasma-enhanced CVD process (PECVD) can be employed if a lower thermal budget is desired. In another alternative embodiment, a microwave-excited plasma enhanced CVD of poly-silicon using $SiH_4$/Xe at temperature as low as 300° C. can be performed to deposit the polysilicon layer 406 as disclosed by Shindo et al., ibid. p. 3134–3138. According to this process embodiment, the resulting grain size of the poly-silicon film was measured to be approximately 25 nm. Shindo et al. claim that the low-energy (approximately 3 eV), high-flux, ion bombardment utilizing Xe ions on a growing film surface activates the film surface and successfully enhances the surface reaction/migration of silicon, resulting in high quality film formation at low temperatures. In another alternative embodiment, the polysilicon layer 406 can be formed at an even lower temperature, e.g. 150° C., with and without charged species in an electron cyclotron resonance (ECR) plasma-enhanced CVD reactor as disclosed in an article by R. Nozawa et al., entitled "Low temperature polycrystalline silicon film formation with and without charged species in an electron cyclotron resonance $SiH_4$ plasma-enhanced chemical vapor deposition", ibid, p. 2542–2545. In this article, R. Nozawa et al. describe that in using an atomic force microscope they found that the films formed without charged species were smoother than those films formed with charged species. According to the teachings of the present invention, it is important to keep the smoothness of polysilicon layer 406. This will be evident from reading the subsequently described process steps in which another polysilicon layer will be fabricated later onto polysilicon layer 406 with a very thin insulation layer between them. The structure is now as appears in FIG. 4B.

Figure 4C:
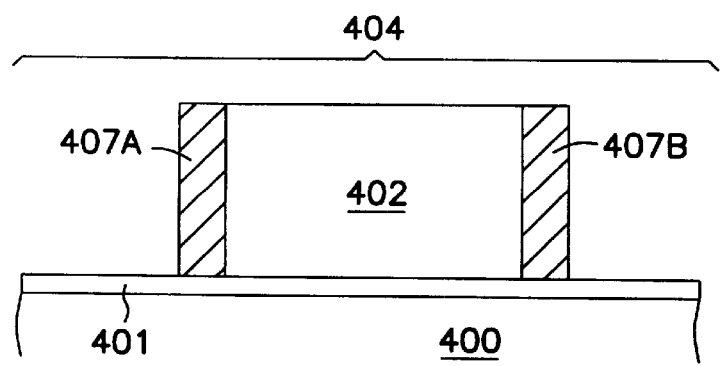

FIG. 4C illustrates the structure following the next sequence of processing steps. FIG. 4C shows a cross section of the resulting vertical gate structures, 407A and 407B, over the active device area 404 after the polysilicon layer 406 has been anisotropically etched. As shown in FIG. 4C, the polysilicon vertical gate structures, 407A and 407B, remain only at the sidewalls of the thick sacrificial oxide 402. In one embodiment, the polysilicon layer 406 is anisotropically etched such that the vertical gate structures, 407A and 407B remaining at the sidewalls of the thick sacrificial oxide 402 have a horizontal width (W1) of approximately 100 nanometers (nm). In one embodiment, the polysilicon layer 406 can be anisotropically etched to form the vertical gate structures, 407A and 407B, through the use of a high-density plasma helicon source for anisotropic etching of a dual-layer stack of poly-silicon on $Si_{1-x}Ge_x$, as described in an article by Vallon et al., entitled "Poly-silicon-germanium gate patterning studies in a high density plasma helicon source", J. Vac. Sci. technol., A, 15(4), p. 1874–80, 1997. The same is incorporated herein by reference. In this article, wafers were described as being etched in a low pressure, high density plasma helicon source using various gas mixtures of $Cl_2$, HBr, and $O_2$. Also, according to this article, process conditions were optimized to minimize the gate oxide 401 consumption. The structure is now as shown in FIG. 4C.

Figure 4D:
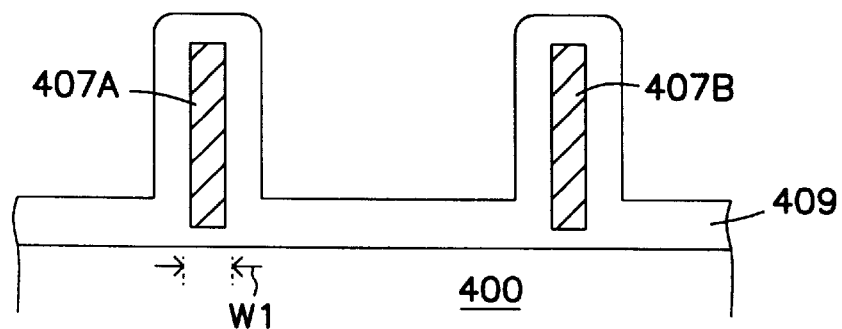

FIG. 4D illustrates the structure after the next series of process steps. In FIG. 4D, the thick sacrificial oxide 402 is removed. As one of ordinary skill in the art will understand upon reading this disclosure the thick sacrificial oxide layer can be removed using any suitable, oxide selective etching technique. As shown in FIG. 4D, the remaining polysilicon vertical gate structures, 407A and 407B, are oxidized to form insulator, intergate dielectric, oxide layer, or silicon dioxide ($SiO_2$) layer 409. In one embodiment, a conventional thermal oxidation of silicon may be utilized at a high temperature, e.g. greater than 900° C. In an alternative embodiment, for purposes of maintaining a low thermal budget for advanced ULSI technology, a lower temperature process can be used. One such low temperature process includes the formation of high-quality silicon dioxide films by electron cyclotron resonance (ECR) plasma oxidation at temperature as low as 400° C. as described in an article by Landheer, D. et al., entitled "Formation of high-quality silicon dioxide films by electron cyclotron resonance plasma oxidation and plasma-enhanced chemical vapor deposition", Thin Solid Films, vol. 293, no. 1–2, p. 52–62, 1997. The same is incorporated herein by reference. Another such low temperature process includes a low temperature oxidation method using a hollow cathode enhanced plasma oxidation system as described in an article by Usami, K. et al., entitled "Thin Si oxide films for MIS tunnel emitter by hollow cathode enhanced plasma oxidation", Thin Solid Films, vol. 281–282, no. 1–2, p. 412–414, 1996. The same is incorporated herein by reference. Yet another low temperature process includes a low temperature VUV enhanced growth of thin silicon dioxide films at low temperatures below 400° C. as described in an article by Patel, P. et al., entitled "Low temperature VUV enhanced growth of thin silicon dioxide films", Applied Surface Science, vol. 46, p. 352–6, 1990. The same is incorporated herein by reference.

Figure 4E:
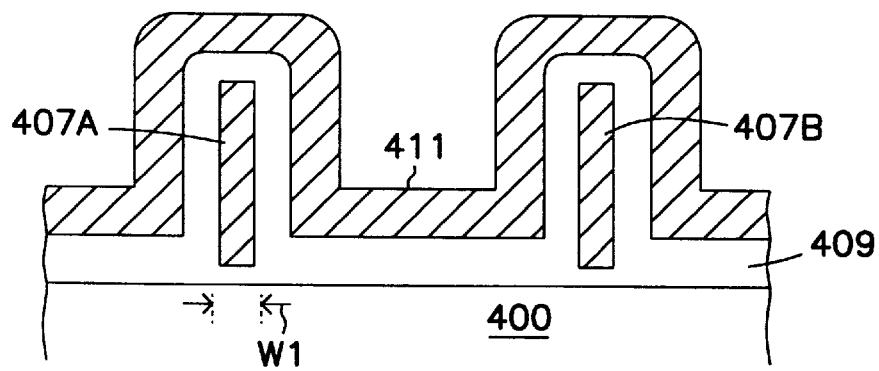

FIG. 4E shows the structure following the next series of steps. In FIG. 4E, another, or second, polysilicon layer 411 is formed over the oxide layer 409 to a thickness of approximately 100 nm. Forming the second polysilicon layer 411 over the oxide layer 409 can be performed using any similar technique to those used in forming the first polysilicon layer 406 as described in detail in connection with FIG. 4B. As shown in FIG. 4E, the second polysilicon layer 411 will be separated by a second oxide thickness, or second insulator thickness (t2) from the active device region 404 which is slightly greater than the thin tunnel oxide thickness, e.g. first oxide thickness or first insulator thickness (t1) which separates the vertical gate structures 407A and 407B from the substrate 400. In one embodiment the second oxide thickness, or second insulator material thickness (t2) is approximately 100 Angstroms (Å) thick. The structure is now as appears in FIG. 4E.

Figure 4F:
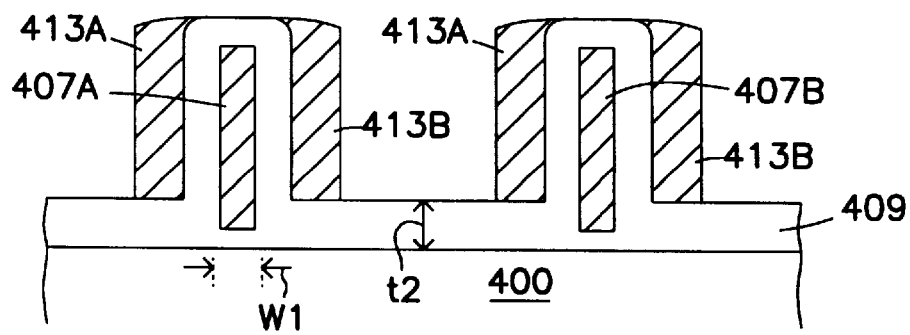

FIG. 4F illustrates the structure after the next series of steps. In FIG. 4F, the structure is once again subjected to an anisotropic etch. The anisotropic etch includes the anisotropic etching process used for etching the first polysilicon layer 406 to form the vertical gate structures 407A and 407B as described in more detail in connection with FIG. 4C. FIG. 4F shows one embodiment of the present invention in which the resulting structure is symmetrical, including two groups of three free standing vertical polysilicon gates. The two groups of three free standing vertical gates include the original vertical gate structures 407A and 407B, and new vertical gate structures 413A and 413B parallel to and on opposing sides of each original vertical gate structures 407A and 407B. This structure embodiment is now as appears in FIG. 4F.

Figure 4G:
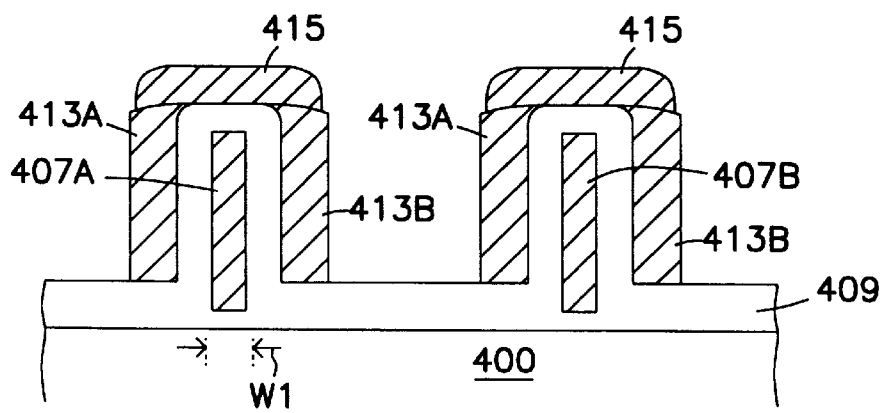

In FIG. 4G, the process is continued to form horizontal polysilicon gate structures above the original vertical gate structures 407A and 407B, and new vertical gate structures 413A and 413B on opposing sides of each original vertical gate structures 407A and 407B. In FIG. 4G, the new vertical gate structures 413A and 413B are connected by forming a third polysilicon layer 415 over a top surface of the structure shown in FIG. 4F. The third polysilicon layer 415 can be formed over the top surface of the structure shown in FIG. 4F using any similar technique to those used in forming the first polysilicon layer 406 as described in detail in connection with FIG. 4B. In one embodiment, according to the teachings of the present invention, the third polysilicon layer 415 is formed to a thickness of approximately 100 nm. In one embodiment, forming the third polysilicon layer 415 is followed by masking and etching techniques, as the same have been described above, in order to leave horizontal polysilicon gate structures 415 only above and connecting the vertical gate structures 413A and 413B. The structure is now as appears in FIG. 4G. FIG. 4G thus represent a symmetrical structure embodiment of the present invention in which the vertical gate structures 413A and 413B, which are parallel to and on opposing sides of each vertical gate structures 407A and 407B, are coupled by the horizontal polysilicon gate structures 415 above the vertical gate structures 407A and 407B. As shown in FIG. 4G, the vertical gate structures 413A and 413B coupled by the horizontal polysilicon gate structures 415 are isolated from vertical gate structures 407A and 407B by insulator layer or oxide layer 409.

In one embodiment, illustrated by FIG. 4H, the structure of FIG. 4G can be anisotropically etched using masking techniques known to one of ordinary skill in the art, as well as the anisotropic etching processes described in connection with FIG. 4F, to produce asymmetrical vertical gate structures. These asymmetrical vertical gate structures will include the original vertical gate structures 407A and 407B, and one remaining vertical gate structure, either 413A or 413B on one side or he other of each original vertical gate structures 407A and 407B as well as a horizontal gate structure 415 depending on the chosen condition of the anisotropic etch process. That is, the anisotropic etch can be performed to leave horizontal gate structure 415 coupled to and above either vertical gate structure 413A or 413B on one side or the other of each original vertical gate structures 407A and 407B. The same is shown in FIG. 4H.

Figure 4H:
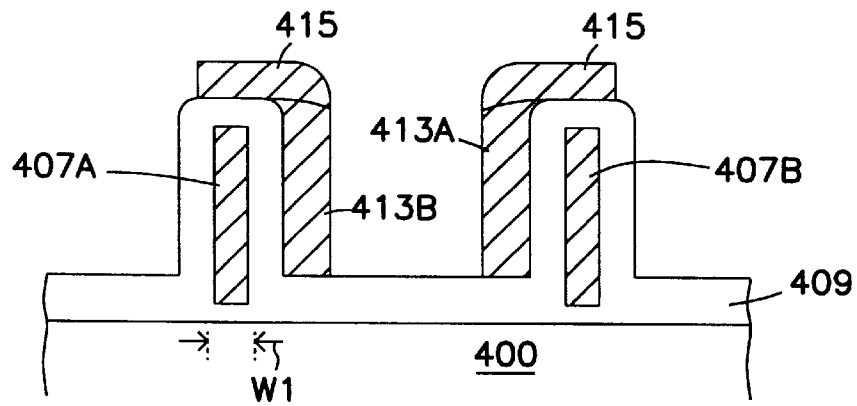
Figure 4I:
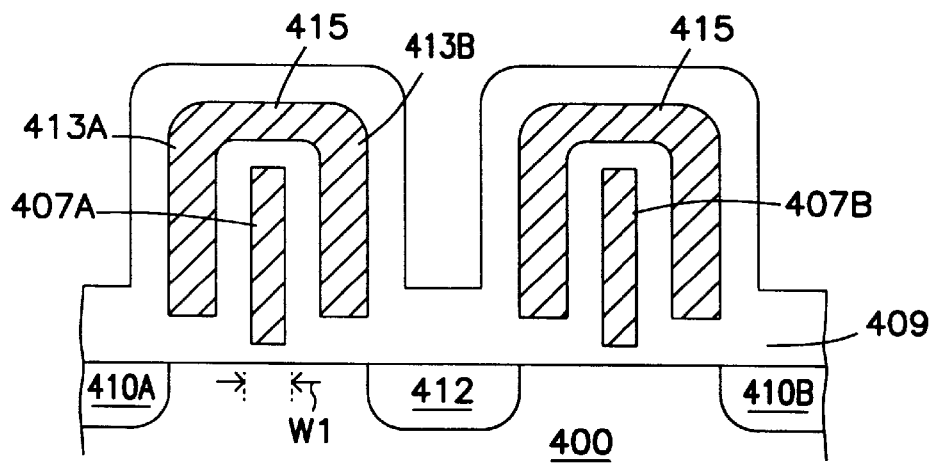

The next series of process steps can continue from either FIGS. 4G or 4H. For purposes of illustration, FIG. 4I provides an illustration of the process steps continued from FIG. 4G. However, one of ordinary skill in the art will understand that analogous process steps may be used to continue the fabrication process from the structure shown in FIG. 4H. In FIG. 4I, the structure from FIG. 4G is oxidized to form an oxide layer of approximately 50 nm. The oxidation process of the structure shown in FIG. 4G can be performed using any suitable technique as the same has been describe above. An ion implantation is then performed to activate source regions shown as 410A and 410B as well as drain region 412. In FIG. 4I, the drain region 412 is illustrated as shared between vertical gate structure 407A and 407B.

One of ordinary skill in the art will understand that other source and drain region configurations can be activated through various ion implantation techniques. Additionally, in one embodiment, the source and/or drain regions can be fabricated with source and/or drain extensions, e.g. similar to source extensions shown in connection with FIG. 3A for facilitating tunneling, by using a masking step and another implantation as the same is known and understood by one of ordinary skill in the art of memory technology. Further conventional process steps can then be used to contact the source, drain and control gate portions of the structure to complete the device of either FIG. 2A or FIG. 3A.

As described above, the structures can be completed such that vertical gates 407A and 407B serve as floating gates for the device structures and vertical gates 413A and 413B serve as control gates. Alternatively, the structures can be completed such that vertical gates 407A and 407B serve as a control gate for the device structures and vertical gates 413A and 413B serve as floating gates.

Figure 1B:
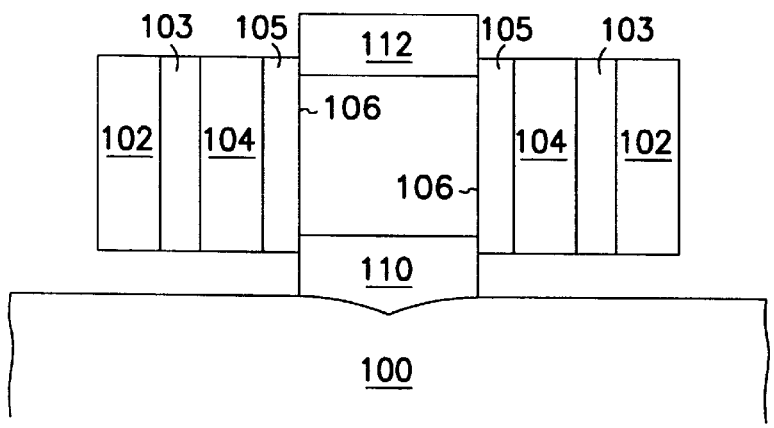
FIG. 1B is an illustration of a vertical EEPROM, EAPROM, or flash memory device formed according to the teachings of the existing art.
Figure 1C:
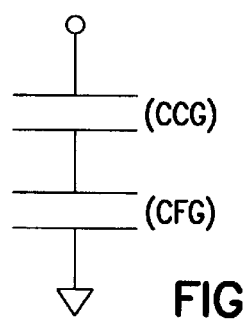
FIG. 1C is a schematic diagram illustrating the generally equivalent capacitances of the control gate (CCG) and the floating gate (CFG) according to the existing art.

As will be understood by reading this disclosure, the memory cells, or floating gate transistors, of the present invention can be fabricated such that the total capacitance of the device is about the same as that of prior art horizontal or vertical floating gate transistor structures, e.g. FIGS. 1A and 1B, of comparable source/drain spacings. However, now since the floating gate capacitance (CFG) for the novel memory cells of the present invention is much smaller than the control gate capacitance (CCG) the majority of any voltage applied to the control gate will appear across the floating gate thin tunnel oxide 401. The floating gate can then be programmed and erased by tunneling of electrons to and from the source of the transistor at relatively low voltages, or programmed by hot electron injection and erased by tunneling.

The operation of the novel memory cells of the present invention is illustrated in connection with FIGS. 5A–5E. As explained above, the novel device of the present invention will function on tunneling of electrons to and from the source region of the device for both writing and erase operations, or operate in a tunnel-tunnel mode in conjunction with hot electron injection.

Figure 5A:
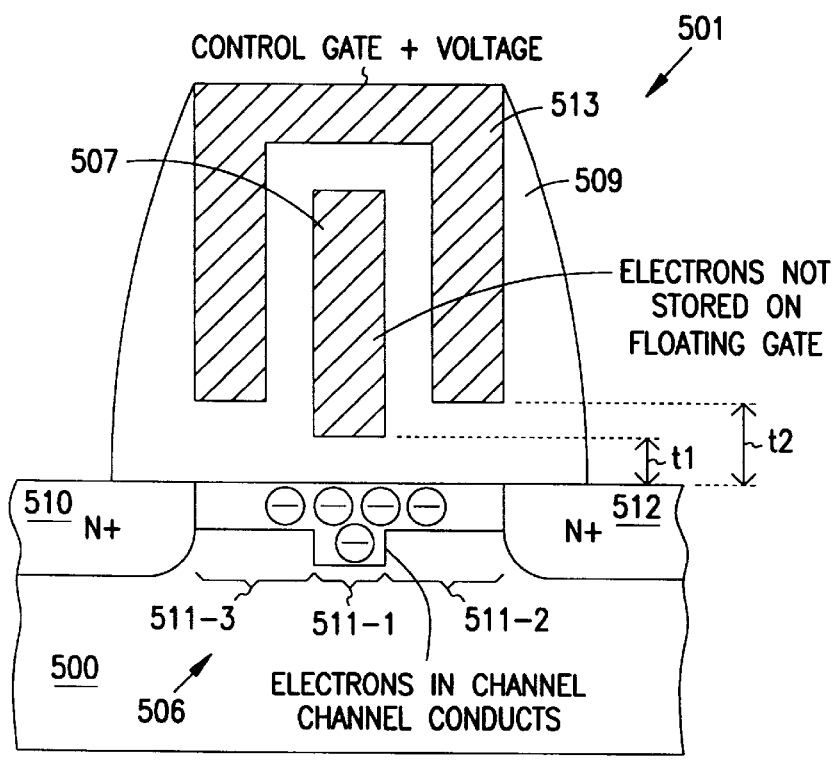
FIGS. 5A–5E are block diagrams illustrating embodiments of the methods for operating the novel memory cells of the present invention.
Figure 5B:
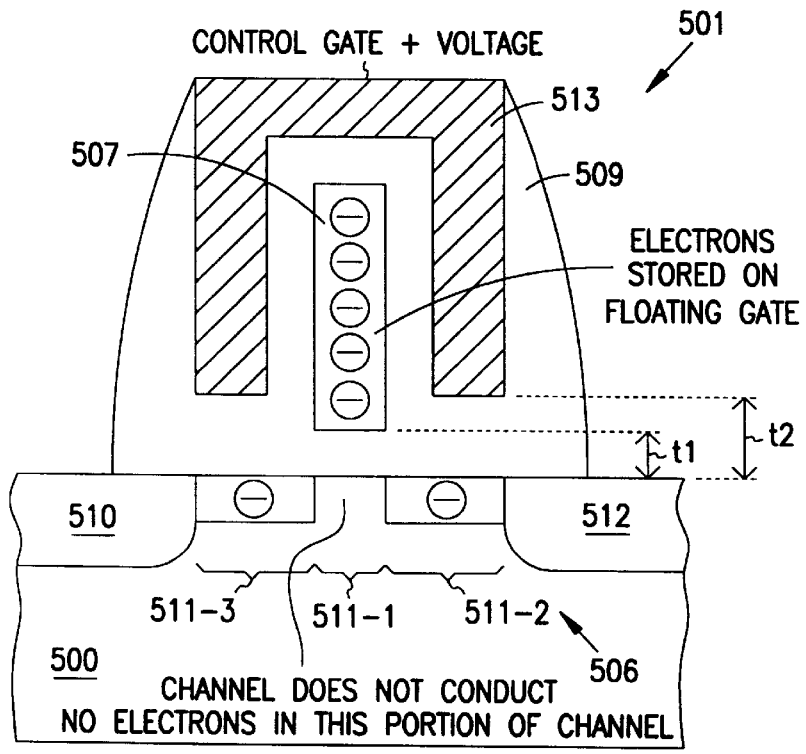

FIGS. 5A–5B illustrate the operation of the novel memory cell of FIG. 2A when the outer vertical gates serve as the control gate. In this embodiment, the novel device 501 of the present invention will function on tunneling of electrons to and from the channel 506 of the device 501 for both writing and erase operations as the same are known and understood by one of ordinary skill in the art. As shown in FIG. 5A, if no electrons are stored on the floating gate 507, then when a potential is applied to the control gate 513, the region of the channel 511-1 beneath the floating gate 507 will actually have a slightly lower threshold voltage (Vt) than the other regions of the channel where the slightly thicker gate oxides (t2) separate the control gate 513 from the channel 506, and the transistor will readily turn on, at lower than conventional control gate voltages, when a read voltage is applied to the control gate 513. In this respect the device functions in a manner analogous to a flash memory cell. On the other hand, as shown in FIG. 5B, if electrons are stored on the floating gate 507, this region of the channel 511-1 beneath the floating gate 507 will have a high threshold voltage (Vt) and will not turn on and conduct when the same low voltage is applied to the control gate 513 to read the memory cell. There are simply no electrons in this region of the channel 511-1 beneath the floating gate 507 to conduct.

Figure 5C:
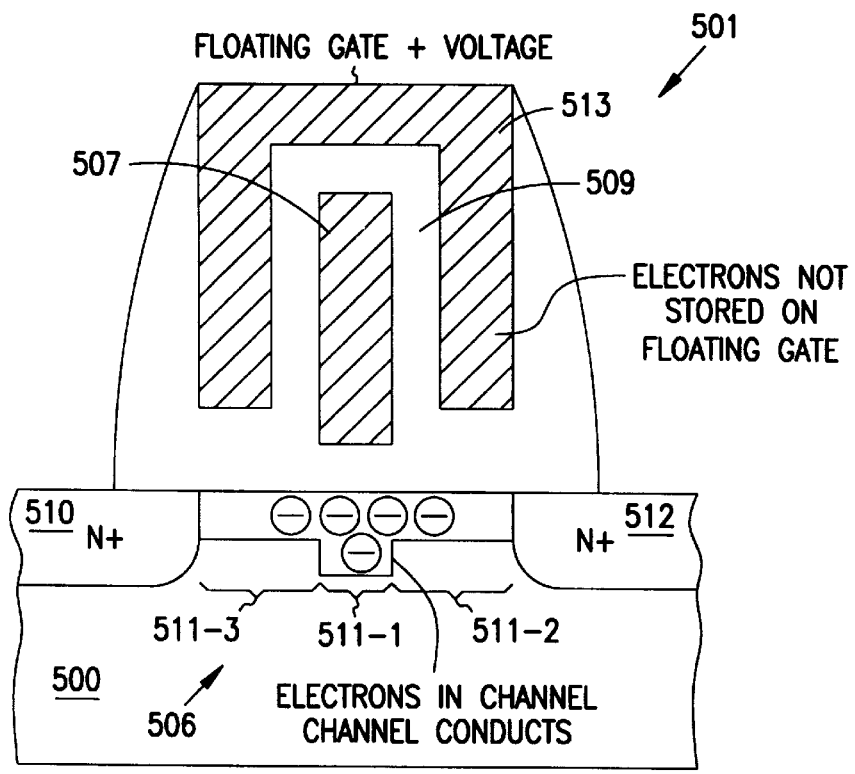
Figure 5D:
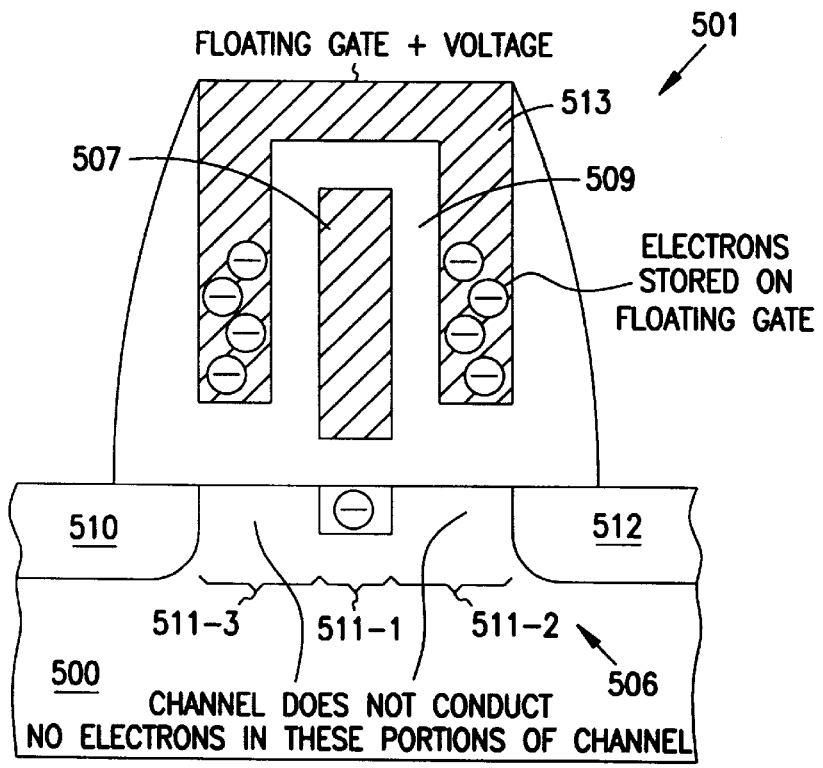

An alternative embodiment is to interchange the functions of the gates, the inner gate 507 becoming the control gate 507 and the outer gate 513 becoming the floating gate 513 as shown in FIGS. 5C–5D. In this embodiment, as shown in FIG. 5C, again with no electrons stored on the floating gate 513, when a potential is applied to the control gate 507, the region of the channel beneath 511-1 the control gate 507 will actually have a slightly lower threshold voltage (Vt) than the other regions of the channel where the slightly thicker gate oxides (t2) separate the floating gate 513 from the channel 506, and the transistor will readily turn on at lower than conventional control gate 507 voltages, when a read voltage is applied to the control gate 507. On the other hand, as shown in FIG. 5D, if electrons are stored on the floating gate 513, the other regions of the channel where the slightly thicker gate oxides (t2) separate the floating gate 513 from the channel 506 will have a high threshold voltage (Vt) and will not turn on and conduct when the same low voltage is applied to the control gate 507 to read the memory cell. There are simply no electrons in these other regions of the channel, e.g. regions 511-2 and 511-3 where the slightly thicker gate oxides (t2) separate the floating gate 513 from the channel 506, to conduct.

Figure 5E:
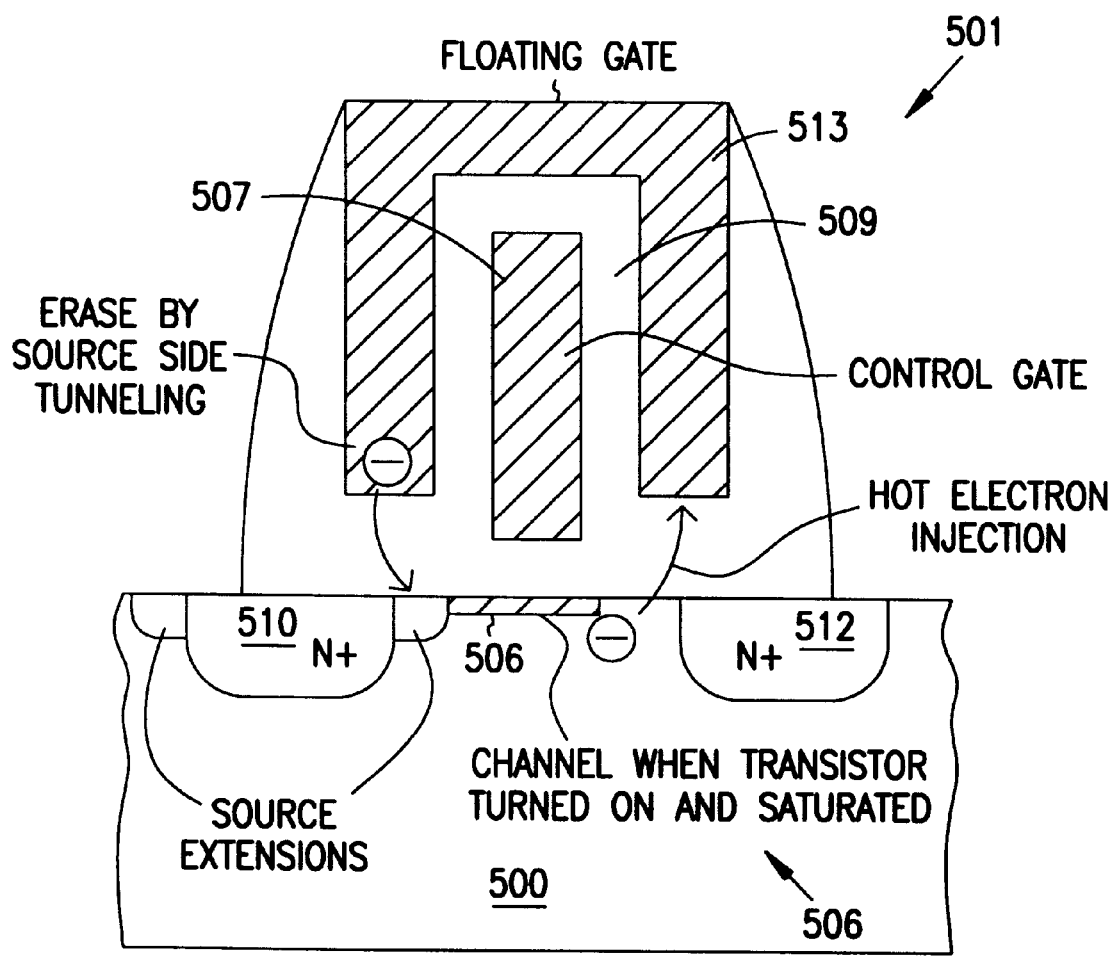

As shown in FIG. 5E, in this later embodiment of FIGS. 5C–5D, the erase operation will be performed using source side 510 tunneling. The write operation, however, will use hot electron injection from the channel 506 at the drain region 512 to write electrons on to the floating gate 513 as is commonly done in some flash memory cells. As one of ordinary skill will understand upon reading this disclosure, similar operation modes can be employed based on the particular floating gate to control gate configuration selection for the structure embodiment shown in FIG. 3A. The field programmable, in service or in circuit programmable, logic devices described here work with much lower voltages than the normal devices used in current decode circuit technology. They can be programmed with Voltages of 5 to 7 Volts and the normal operating voltages on the control gates can be of the order 2 Volt or so. The low programming voltage is a consequence of the high capacitance ratio between the control gate and floating gate.

Figure 6:
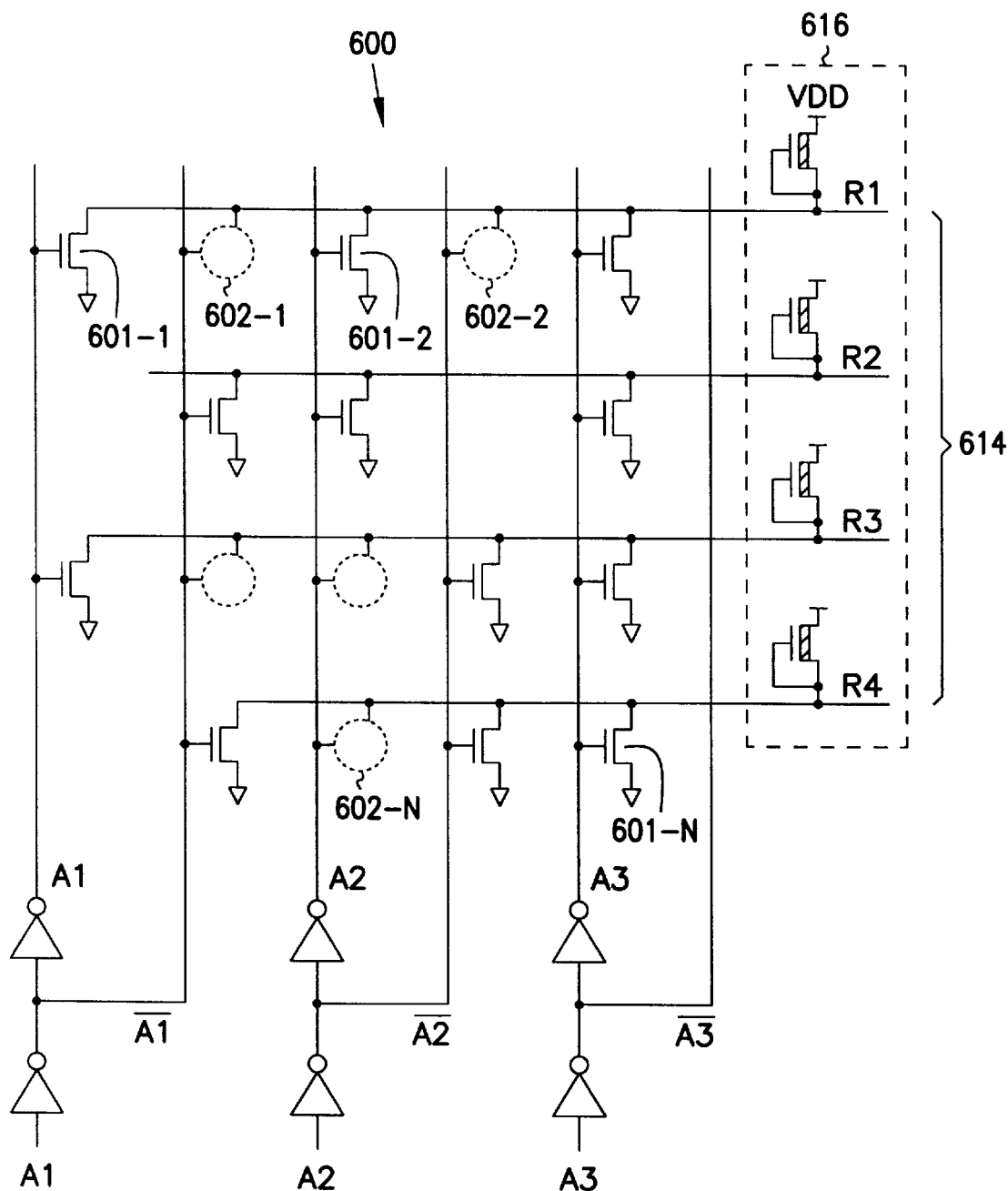
FIG. 6 shows a conventional NOR decode array for memory circuits according to the teachings of the prior art.

FIG. 6 shows a conventional NOR decode array for memory circuits. The address lines are A1 through A3 and inverse address lines, $\overline{A1}$ through $\overline{A3}$. The conventional NOR decode array is programmable at the gate mask level by either fabricating a thin oxide gate transistor, e.g. transistors 601-1, 601-2, . . . , 601-N, at the intersection of lines in the array or not fabricating a thin oxide gate transistor, e.g. missing thin oxide transistors, 602-1, 602-2, . . . , 602-N, at such an intersection. As one of ordinary skill in the art will understand upon reading this disclosure, the same technique is conventionally used to form other types of decode arrays not shown. As shown in FIG. 6A, a number of depletion mode NMOS transistors, 616, are used as load devices.

In this embodiment, each of the row lines 614 acts as a NOR gate for the address lines A1 through A3 and inverse address lines, $\overline{A1}$ through $\overline{A3}$ that are connected to the row lines 614 through the thin oxide gate transistor, e.g. transistors 601-1, 601-2, . . . , 601-N, of the array. That is, row line R1 is maintained at a high potential, +VDD, in the positive logic NMOS decode array shown in FIG. 6A, unless one or more of the thin oxide gate transistor, e.g. transistors 601-1, 601-2, . . . , 601-N, that are coupled to row line R1 are turned on by a high logic level signal, +VDD, on one of the address lines A1 through A3 or inverse address lines, $\overline{A1}$ through $\overline{A3}$. When a transistor gate address is activated, by the high logic level signal, +VDD, through address lines A1 through A3 or inverse address lines, $\overline{A1}$ through $\overline{A3}$, each thin oxide gate transistor, e.g. transistors 601-1, 601-2, . . . , 601-N, conducts, or is turned "on." This conduction of the thin oxide gate transistor, e.g. transistors 601-1, 601-2, . . . , 601-N, performs the NOR positive logic circuit function, an inversion of the OR circuit function results from inversion of data onto the row lines 614 through the thin oxide gate transistor, e.g. transistors 601-1, 601-2, . . . , 601-N, of the array, in order to output a low logic level signal on the row lines 614. Thus, a particular row line 614 is addressed when none of the thin oxide gate transistor, e.g. transistors 601-1, 601-2, . . . , 601-N, coupled to that row line 614 are turned "on."

Again, the incoming address on each line is inverted and the combination of the original address and inverted or complemented values used to drive the gates of transistors in the decode array 600. The transistors 601-1, 601-2, . . . , 601-N in the array 600 are enhancement mode NMOS devices and depletion mode NMOS transistors are used as load devices 616. All voltages are positive in a simple NMOS circuit. This is a positive logic NOR decode array, the logic one state, "1" is the most positive voltage, +VDD, and the logic level zero, "0" is the least positive voltage or ground.

The transistors used in FIG. 6 are NMOS driver transistors with a depletion mode NMOS load technology. The load device or NMOS load transistor is a depletion mode or normally "on" transistor which acts as a constant current source during the pull up switching transient thus providing high switching speed. The driver transistor is an enhancement mode NMOS transistor which is normally "off" with zero gate bias.

Figure 7:
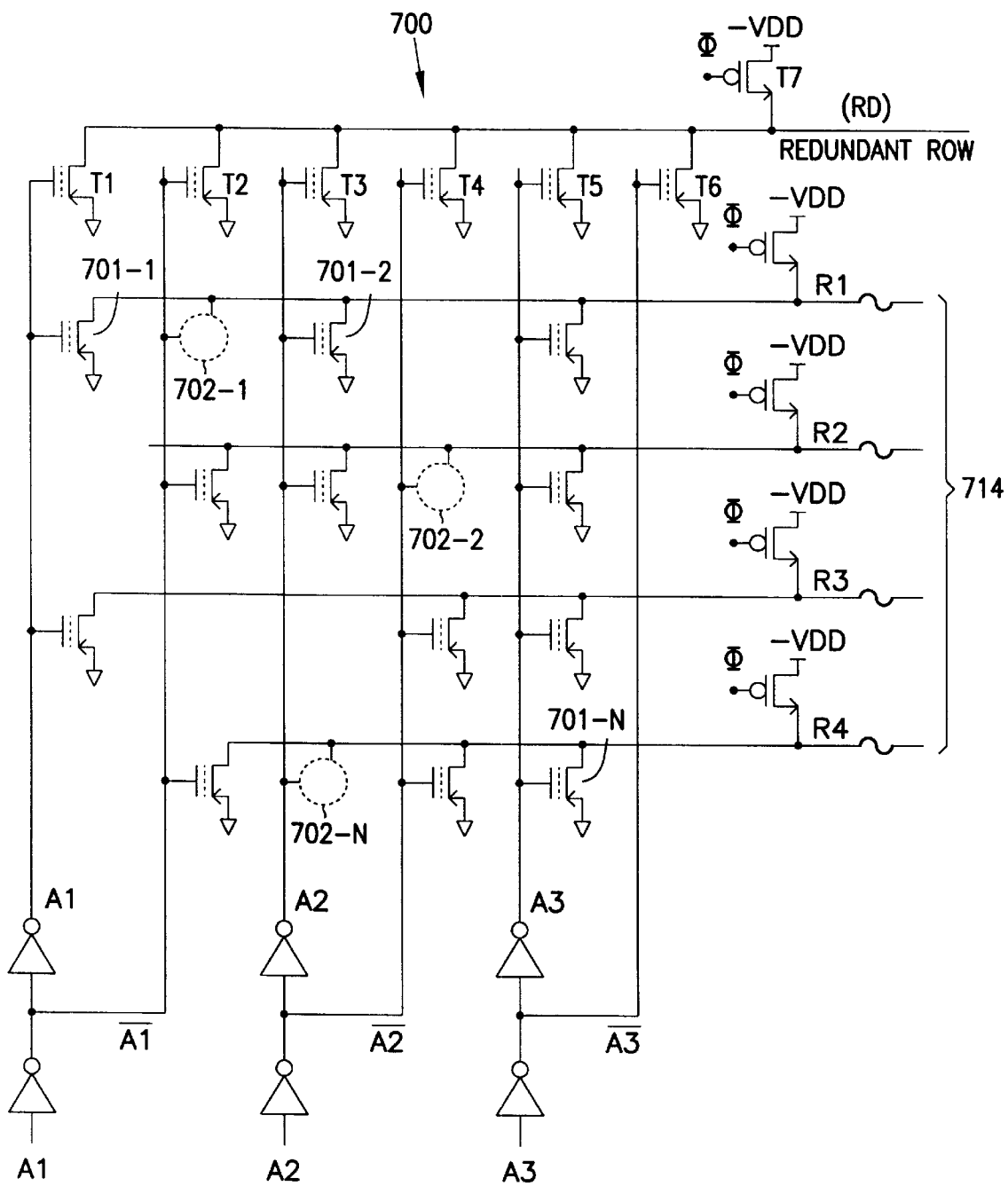
FIG. 7 is a schematic diagram illustrating an embodiment of a decode circuit, or memory address decoder, according to the teachings of the present invention.

FIG. 7 is a schematic diagram illustrating one embodiment of a decode circuit, or memory address decoder, 700 according to the teachings of the present invention. Analogous to FIG. 6, the address lines are A1 through A3 and inverse address lines, $\overline{A1}$ through $\overline{A3}$. As shown in FIG. 7, the decode circuit 700 is programmable at the gate mask level by either fabricating a driver transistor, or logic cell, e.g. transistors 701-1, 701-2, . . . , 701-N, at the intersection of lines in the array or not fabricating a driver transistor, or logic cell, e.g. missing floating gate river transistors 702-1, 702-2, . . . , 702-N, at such an intersection. In one embodiment according to the teachings of the present invention, fabricating a driver transistor, e.g. transistors 701-1, 701-2, . . . , 701-N, at the intersection of lines in the array includes fabricating the floating gate driver transistor according to the embodiments discussed and described in detail in connection with FIGS. 2A–5E. In one embodiment of the present invention, as shown in FIG. 7, a number of p-channel metal oxide semiconductor (PMOS) load transistors, 716, are used as load devices and are coupled to the output lines, or row lines, 714, of the decode circuit 700.

The incoming address on each address line A1 through A3 is inverted and the combination of the original address on each address line A1 through A3 and inverted or complemented values on inverse address lines, $\overline{A1}$ through $\overline{A3}$, used to drive the gates of transistors 701-1, 701-2, . . . , 701-N in the decode array 700. The floating gate driver transistors, or logic cells, e.g. transistors 701-1, 701-2, . . . , 701N in the array 700 are n-channel floating gate driver transistors.

In FIG. 7, each of the row lines 714 acts as a NOR gate for the address lines A1 through A3 and inverse address lines, $\overline{A1}$ through $\overline{A3}$ that are connected to the row lines 714 through the floating gate driver transistors, or logic cells, e.g. transistors 701-1, 701-2, . . . , 701-N, of the array 700. That is, row line R1 is maintained at a high potential VDD, or logic "1" unless one or more of the floating gate driver transistors, or logic cells, e.g. transistors 701-1, 701-2, . . . , 701-N, that are coupled to row line R1 are turned on by a high logic level signal, VDD, on one of the address lines A1 through A3 or inverse address lines, $\overline{A1}$ through $\overline{A3}$. In the decode circuit 700 configuration shown in FIG. 7, a logic "1", or VDD, on one of the address lines A1 through A3 or inverse address lines, $\overline{A1}$ through $\overline{A3}$, is required in order to turn on one of the n-channel floating gate driver transistors, or logic cells, e.g. transistors 701-1, 701-2, . . . , 701-N, coupled to row line R1.

For the decode circuit 700 of the present invention, shown in FIG. 7, the driver transistors, e.g. transistors 701-1, 701-2, . . . , 701-N in the array are floating gate transistor devices. In one embodiment, the floating gate driver transistors 701-1, 701-2, . . . , 701 -N are formed according to the embodiments of the present invention as disclosed and described in detail in connection with FIGS. 2A–5E. In this manner, the floating gate driver transistors, 701-1, 701-2, . . . , 701-N, can be programmed initially in fabrication and can be reprogrammed as necessary once the decode array is in service, e.g. field programmable, to implement a specific decode function. The load devices 716, shown in the address decoder 700 of FIG. 7, are p-channel metal oxide semiconductor (PMOS) transistors and not depletion mode n-channel transistors as is more usual. In this manner, the decode circuit 700 embodiment of the present invention shown in FIG. 7 is formed according to a CMOS process and can be referred to as a CMOS decode array 700.

As shown in FIG. 7, the decode circuit 700 of the present invention includes at least one redundant row line, RD. As shown in FIG. 7, a number of additional driver transistors, e.g. transistors T1–T6, are provided in the array coupled to address lines A1 through A3 or inverse address lines, $\overline{A1}$ through $\overline{A3}$ and the redundant row line, RD. According to the teachings of the present invention, these additional driver transistors, e.g. transistors T1–T6, are formed according to the embodiments described and discussed in detail above in connection with FIGS. 2A–5E and as disclosed in co-filed, co-pending, commonly assigned U.S. patent application: entitled "Horizontal Memory Devices with Vertical Gates," Ser. No. 09/584,566, which disclosure is herein incorporated by reference. According to the teachings of the present invention, the additional driver transistors, T1–T6, will have a vertical control gate, located above a horizontal channel region, coupled to address lines A1 through A3 or inverse address lines, $\overline{A1}$ through $\overline{A3}$. The additional driver transistors, T1–T6, will further have a drain region coupled to the at least one redundant row line, or wordline, RD. A p-channel metal oxide semiconductor (PMOS) load transistor T7, similar to p-chanel metal oxide semiconductor (PMOS) load transistors 716 is coupled to the at least one redundant row line, RD as well to complete the CMOS inverter configuration.

As has been shown and described above, these non volatile, floating gate driver transistors, e.g. transistors T1–T6, can be programmed to have two different conductivity states depending upon whether electrons are stored on the vertical floating gate. When a charge is stored on the vertical floating gate for any one of these floating gate driver transistors, e.g. transistors T1–T6, the floating gate transistor is effectively removed from the programmable memory address and decode circuits 700 of the present invention. The implementation of these floating gate driver transistors, e.g. transistors T1–T6, in the decode circuit 700 of the present invention, enables error correction for replacing a row, or column in the array as will be explained in more detail below.

According to the teachings of the present invention, it is desirable to have redundant row lines, e.g. redundant row line RD, available to replace or error correct for row lines 714, which are determined defective or which have failed in the field. The present invention is usable to provide such error correction by replacing a row, or column, in a memory array.

One of ordinary skill in the art will understand upon reading this disclosure that there can be more than one redundant row line, e.g. a RD2, RD3, etc. (not shown), and similarly more additional floating gate driver transistors, like transistors T1–T6, coupled thereto in order to enable multiple row error correction. One of ordinary skill in the art will further understand, upon reading this disclosure, the manner in which the additional floating gate driver transistors, T1–T6, formed according to the teachings of the present invention, can be selectively programmed in order to access, or select, redundant rows RD in replacement for any one of the output lines 714 in the decode array 700.

In summary, If electrons are stored on a vertical floating gate for one of the additional floating gate driver transistors, T1–T6, then when a high input signal is received on address lines A1 through A3 or inverse address lines, $\overline{A1}$ through $\overline{A3}$, the "programmed floating gate driver transistor, T1–T6, will remain "off." On the other hand, if there is no stored charge on the vertical floating gate for that particular floating gate driver transistors, T1–T6, then the floating gate driver transistors, T1–T6, will conduct when a high input signal is received on address lines A1 through A3 or inverse address lines, $\overline{A1}$ through $\overline{A3}$. If the floating gate driver transistors, T1–T6, have no charge stored on the vertical floating gate they will function as normal inverters for the decode circuit 700. Conversely, if there is a charge stored charge on the vertical floating gate, the conductivity of the floating gate driver transistors, T1–T6, will not become high enough and will not function as a driver transistor. In this latter case, the output for the redundant row line RD in the decode circuit 700 of the present invention will not change charge states. Hence, if there is a charge stored on the vertical floating gate of the floating gate driver transistors, T1–T6, the drivers are effectively removed from the decode circuits 700.

As one of ordinary skill in the art will further understand upon reading this disclosure, additional inverters can be used as necessary to affect the transition from one logic system, e.g. positive logic system, to a negative logic system while still capitalizing on the utility of the novel floating gate driver transistors T1–T6 in decode circuit 700. If the floating gate in a floating gate driver transistor is programmed with a negative charge on the floating gate it will not be active in the array and it is effectively removed from the array. In this manner the array logic functions can be programmed even when the circuit is in the final circuit or in the field and being used in a system. The field programmable, in service or in circuit programmable, logic devices described here work with much lower voltages than the normal devices used in current in field, or in service, programmable decode circuit technology. They can be programmed with Voltages of 5 to 7 Volts and the normal operating voltages on the vertical control gates can be of the order 2 Volt or so. The low programming voltage is a consequence of the high capacitance ratio between the control gate and floating gate.

Figure 8:
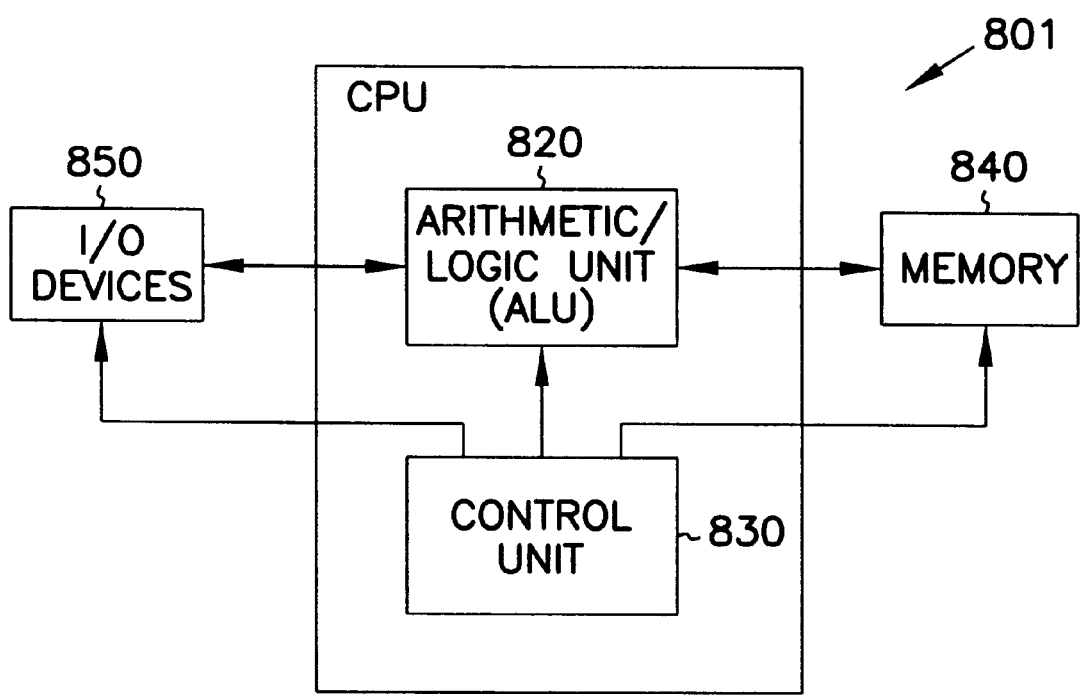
FIG. 8 is a simplified block diagram of a high-level organization of an electronic system according to the teachings of the present invention.

FIG. 8 is a simplified block diagram of a high-level organization of an electronic system 801 according to the teachings of the present invention. As shown in FIG. 8, the electronic system 801 is a system whose functional elements consist of an arithmetic/logic unit (ALU) 820, a control unit 830, a memory unit 840 and an input/output (I/O) device 850. Generally such an electronic system 801 will have a native set of instructions that specify operations to be performed on data by the ALU 820 and other interactions between the ALU 820, the memory unit 840 and the I/O devices 850. The memory units 840 contain the data plus a stored list of instructions.

The control unit 830 coordinates all operations of the ALU 820, the memory unit 840 and the I/O devices 850 by continuously cycling through a set of operations that cause instructions to be fetched from the memory unit 840 and executed. Memory unit 840 can be implemented with a field programmable low voltage decode circuit, according to the teachings of the present invention, to enable error correction by replacing a row, or column, in a memory array.

The Figures presented and described in detail above are similarly useful in describing method of operation embodiments of the present invention. That is one method embodiment of the present invention includes a novel method enabling error correction in a decode circuit which has a number of non volatile vertical floating gate transistors, or memory cells, coupled to a redundant row line. The method includes selectively applying a first potential across a first thickness oxide between a vertical floating gate and a first portion of a horizontal substrate in order to add or remove a charge from the vertical floating gate. The horizontal substrate includes a source region and a drain region separated by a horizontal channel region. The method further includes enabling the redundant row line by applying a second potential to a vertical control gate located above a second portion of the horizontal substrate. According to the teachings of the present invention, the vertical control gate is parallel to and opposing the vertical floating gate. Selectively applying a first potential across a first thickness oxide includes selectively applying a first potential of less than 5 Volts. Selectively applying a first potential across a first thickness oxide between a vertical floating gate and a first portion of a horizontal substrate in order to add or remove a charge from the vertical floating gate includes controlling conduction in the horizontal channel. Enabling the redundant row line by applying a second potential includes applying a second potential of approximately 2 Volts. According to the teachings of the present invention, enabling the redundant row line by applying a second potential to the vertical control gate includes enabling the redundant row when a minimal or no charge is present on the vertical floating gate of the non volatile memory cell coupled to that redundant row line.

Another method embodiment according to the teachings of the present invention includes a method for enabling error correction in a decode circuit which has a number of non volatile vertical floating gate transistors coupled to a redundant row line. This method embodiment includes selectively storing a limited charge on a vertical floating gate above a horizontal channel region in the number of non volatile floating gate transistors. Selectively storing the limited charge on the vertical floating gate controls addressing the redundant row line. The method further includes applying a potential to a vertical control gate opposing the vertical floating gate and above the horizontal channel using a number of address lines. Applying a potential to a vertical control opposing the vertical floating gate includes applying a potential of approximately 2 Volts. Selectively storing a limited charge on a vertical floating gate above a horizontal channel region in the number of non volatile floating gate transistors further includes programming the vertical floating gate by applying a potential of less than 5 Volts to the vertical control gate. Applying a potential of less than 5 Volts to the vertical control is such that a greater percentage of the applied potential appears between the vertical floating gate and the horizontal channel than between the vertical floating gate and the vertical control gate. Selectively storing a limited charge on a vertical floating gate above a horizontal channel region includes selectively storing a limited charge on a vertical floating gate separated by a first oxide thickness from the horizontal channel. Applying a potential to a vertical control gate opposing the vertical floating gate and above the horizontal channel includes applying the potential to a vertical control gate separated by a second oxide thickness from the horizontal channel. In one embodiment, applying the potential to the vertical control gate separated by the second oxide thickness includes applying the potential to the vertical control gate separated by a second oxide thickness which is greater than the first oxide thickness.

Also, according to the teachings of the present invention, the method further includes selectively removing a charge from a vertical floating gate above a horizontal channel region in the number of non volatile floating gate transistors. As has been described, selectively storing a charge on a vertical floating gate above a horizontal channel region in the number of non volatile floating gate transistors includes disabling the non volatile floating gate transistor in the decode circuit.

CONCLUSION

Thus, structures and methods for field programmable memory address and decode circuits are provided with logic cells, or floating gate transistors, which can operate with lower applied control gate voltages than conventional field programmable memory address and decode circuits. The field programmable memory address and decode circuits of the present invention do not increase the costs or complexity of the fabrication process. These circuits and methods are fully scalable with shrinking design rules and feature sizes in order to provide even higher density integrated circuits. The total capacitance of the logic cells within the field programmable memory address and decode circuits is about the same as that for the prior art of comparable source and drain spacings. However, according to the teachings of the present invention, the floating gate capacitance in the logic cells is much smaller than the control gate capacitance such that the majority of any voltage applied to the control gate will appear across the floating gate thin tunnel oxide. The logic cells in the programmable memory address and decode circuits of the present invention can be programmed by tunneling of electrons to and from the silicon substrate at lower control gate voltages than is possible in the prior art.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An address decoder for a memory device, comprising:
   a number of address lines;
   a number of output lines;
   wherein the address lines, and the output lines form an array;
   a number logic cells that are disposed at the intersections of output lines and address lines; and
   a number of non volatile memory cells are disposed at the intersections of the address lines and at least one output line, the number of non volatile memory cells including:
   a source region in a horizontal substrate;
   a drain region in the horizontal substrate;
   a channel region separating the source and the drain regions;
   a first vertical gate located above a portion of the channel region and separated from the channel region by a first thickness insulator material; and
   a second vertical gate located above another portion of the channel region and separated therefrom by a second thickness insulator material, wherein the second vertical gate opposes the first vertical gate, and wherein the second vertical gate is separated from the first vertical gate by an intergate dielectric.

2. The address decoder of claim 1, wherein the second vertical gate has a horizontal width of approximately 100 nanometers (nm).

3. The address decoder of claim 1, wherein the first thickness insulator material is approximately 60 Angstroms (Å), and wherein the second thickness insulator material is approximately 100 Angstroms (Å).

4. The address decoder of claim 1, wherein the first thickness insulator material, the second thickness insulator material, and the intergate dielectric include silicon dioxide ($SiO_2$).

5. The address decoder of claim 1, wherein the first vertical gate has a vertical height of approximately 500 nanometers (nm) and a horizontal width of approximately 100 Angstroms (Å).

6. The address decoder of claim 1, wherein the number of non volatile memory cells that are disposed at the intersections of the address lines and at least one output line includes an output line which is a redundant row or word line.

7. An address decoder for a memory device, comprising:
   a number of address lines;
   a number of output lines;
   wherein the address lines, and the output lines form an array;
   a number logic cells that are disposed at the intersections of output lines and address lines; and
   a number of non volatile memory cells are disposed at the intersections of the address lines and at least one output line, the number of non volatile memory cells including:

a source region in a horizontal substrate;
a drain region in the horizontal substrate;
a channel region separating the source and the drain regions;
a first vertical gate located above a portion of the channel region and separated from the channel region by a first thickness insulator material; and
a second vertical gate located above another portion of the channel region and separated therefrom by a second thickness insulator material, wherein the second vertical gate is parallel to and opposes the first vertical gate, and wherein the second vertical gate is separated from the first vertical gate by an intergate dielectric.

8. The address decoder of claim 7, wherein the intergate dielectric has a thickness approximately equal to the first thickness insulator material.

9. The address decoder of claim 7, wherein each vertical gate has a vertical height of approximately 500 nanometers (nm) and a horizontal width of approximately 100 nanometers (nm).

10. The address decoder of claim 7, wherein the first thickness insulator material is approximately 60 Angstroms (Å), and wherein the second thickness insulator material is approximately 100 Angstroms (Å).

11. The address decoder of claim 7, wherein the number of non volatile memory cells that are disposed at the intersections of the address lines and at least one output line includes programmable floating gate driver transistors.

12. The address decoder of claim 7, wherein the number of logic cells that are disposed at the intersections of output lines and address lines includes programmable floating gate driver transistors.

13. A decode circuit for a semiconductor memory, comprising:
a number of floating gate transistors having a source region, a drain region, and a channel therebetween;
a number of programmable logic cells, the programmable logic cells, comprising:
a horizontal substrate, wherein the substrate includes a source region, a drain region, and a channel region separating the source and the drain region;
a vertical floating gate separated from a first portion of the channel region by a first oxide thickness; and
at least one vertical control gate separated from a second portion of the channel region by a second oxide thickness, wherein the at least one vertical control gate is parallel to and opposing the vertical floating gate;
a number of address lines coupled to a control gate for the number of floating gate transistors and the vertical control gates for the logic cells; and
a number of output lines coupled to a drain region for the number of floating gate transistors and the logic cells, and wherein the number of output lines includes at least one redundant row line.

14. The decode circuit of claim 13, wherein the number of output lines coupled to a drain region for the number of floating gate transistors and the logic cells includes a p-channel metal oxide semiconductor (PMOS) load transistor coupled thereto.

15. The decode circuit of claim 14, wherein the number of output lines coupled to a drain region for the number of floating gate transistors and the logic cells form an inverter in combination with the PMOS load transistor.

16. The decode circuit of claim 15, wherein the number of programmable logic cells includes n-channel floating gate transistors.

17. The decode circuit of claim 13, wherein each vertical control gate has a horizontal width of approximately 100 Angstroms (Å).

18. The decode circuit of claim 13, wherein each vertical floating gate separated from a first portion of the channel region includes a first portion of the channel region which is adjacent to the source region, and wherein the each vertical control gate separated from a second portion of the channel region includes a second portion of the channel region which is adjacent to the drain region.

19. The decode circuit of claim 13, wherein the each vertical control gate further includes a horizontal member located above the vertical floating gate, wherein the vertical control gate and the horizontal member are separated from the vertical floating gate by an intergate dielectric.

20. The decode circuit of claim 13, wherein a capacitance between the vertical control gate and the vertical floating gate is greater than a capacitance between the vertical floating gate and the channel region.

21. The decode circuit of claim 13, wherein the number of floating gate transistors include a number of floating gate transistors which are selectively coupled to the number of address lines.

22. A memory address decoder, comprising:
a number of thin oxide gate transistors having a source region, a drain region, and a channel therebetween;
a number of non volatile memory cells, the non-volatile memory cells each, comprising:
a horizontal substrate, wherein the substrate includes a source region, a drain region, and a channel region separating the source and the drain region;
a first vertical gate located above a first portion of the channel region and separated from the channel region by a first oxide thickness;
a second vertical gate located above a second portion of the channel region and separated from the channel region by a second oxide thickness, and
a third vertical gate located above a third portion of the channel region and separated from the channel region by the second oxide thickness;
a number of address lines coupled to the gates of the number of thin oxide gate transistors and at least one of the first, second, or third vertical gates in the non volatile memory cells; and
a number of output lines coupled to the drain region of the number of thin oxide gate transistors and non volatile memory cells.

23. The memory address decoder of claim 22, wherein the memory address decoder further includes a number of p-channel metal oxide semiconductor (PMOS) transistors coupled to the number of output lines.

24. The memory address decoder of claim 22, wherein the second and the third vertical gates are on opposing sides of the first vertical gate.

25. The memory address decoder of claim 22, wherein the first vertical gate includes a floating gate and wherein the second and the third vertical gates include control gates coupled to the number of address lines.

26. The memory address decoder of claim 22, wherein first vertical gate includes a control gate coupled to the number of address lines and wherein the second and the third vertical gates include floating gates.

27. The memory address decoder of claim 22, wherein each non-volatile memory cell further includes a horizontal gate member which couples the second and the third vertical gates.

28. A memory address decoder, comprising:
- a number of thin oxide gate transistors having a source region, a drain region, and a channel therebetween;
- a number of non volatile memory cells, the non-volatile memory cells each, comprising:
  - a horizontal substrate, wherein the substrate includes a source region, a drain region, and a channel region separating the source and the drain region;
  - a first vertical gate located above a first portion of the channel region and separated from the channel region by a first oxide thickness;
  - a second vertical gate located above a second portion of the channel region and separated from the channel region by a second oxide thickness, and
  - a third vertical gate located above a third portion of the channel region and separated from the channel region by the second oxide thickness;
- a number of address lines coupled to the gates of the number of thin oxide gate transistors and at least one of the first, second, or third vertical gates in the non volatile memory cells; and
- a number of output lines coupled to the drain region of the number of thin oxide gate transistors and non volatile memory cells, wherein the address lines and the output lines form an array.

29. The memory address decoder of claim 28, wherein at least one of the non volatile memory cells is programmed with a charge on at least one of the first, second, or third vertical gate such that the non volatile memory cell is effectively removed from the array.

30. The memory address decoder of claim 28, wherein the memory address decoder is operatively coupled to a computer system.

31. The memory address decoder of claim 28, wherein each non volatile memory cell includes a flash memory cell.

32. The memory address decoder of claim 28, wherein each non volatile memory cell includes an electronically erasable and programmable read only memory (EEPROM) cell.

33. An address decode circuit for a memory device, comprising:
- a number of thin oxide gate transistors having a source region, a drain region, and a channel therebetween;
- a number of floating gate driver transistors, each floating gate driver transistor, comprising:
  - a horizontal substrate, wherein the substrate includes a source region, a drain region, and a channel region separating the source and the drain region;
  - a vertical floating gate located above a first portion of the channel region adjacent to the source region and separated from the channel region by a first oxide thickness; and
  - a vertical control gate located above a second portion of the channel region adjacent to the drain region and separated from the channel region by a second oxide thickness;
- a number of address lines coupled to the gates of the number of thin oxide gate transistors and the vertical control gates for the floating gate driver transistors; and
- a number of output lines coupled to a drain region for the number of thin oxide gate transistors and floating gate driver transistors; and
- wherein a greater percentage of a voltage applied to the vertical control gate appears between the vertical floating gate and the channel than between the vertical control gate and the vertical floating gate.

34. The address decode circuit of claim 33 wherein the address decode circuit includes a NOR address decoder.

35. The address decode circuit of claim 33 wherein the number of thin oxide gate transistors include a number of n-channel floating gate transistors which are selectively coupled to the number of address lines.

36. The address decode circuit of claim 33 wherein the address decode circuit further includes a number of p-channel metal oxide semiconductor (PMOS) load transistors coupled to the number of output lines.

37. The address decode circuit of claim 33, wherein the number of output lines include at least one redundant row line.

38. The address decode circuit of claim 37 wherein the at least one redundant row line is coupled to a CMOS inverter, and wherein the CMOS inverter includes a PMOS load transistor and at least one of the floating gate driver transistors having a vertical floating gate.

39. The address decode circuit of claim 38, wherein a charge on the vertical floating gate for the at least one floating gate driver transistor controls the operation of the at least one redundant row line.

40. The address decode circuit of claim 33 wherein address decode circuit operates with operating voltages on the vertical control gate of approximately 2 Volts.

41. The address decode circuit of claim 33, wherein the vertical floating gates are programmable with a fixed charge using voltages of less than 5.0 Volts.

42. An electronic system, the electronic system comprising a memory address decoder array, comprising:
- a number of thin oxide gate transistors having a source region, a drain region, and a channel therebetween;
- a number of vertical floating gate transistor logic cells, the logic cells comprising:
  - a horizontal substrate, wherein the substrate includes a source region, a drain region, and a channel region separating the source and the drain region;
  - a first vertical gate separated from a first portion of the channel region by a first oxide thickness; and
  - a second vertical gate separated from a second portion of the channel region by a second oxide thickness, wherein the second vertical gate is opposing the first vertical gate;
- a number of address lines coupled to the gates of the number of thin oxide gate transistors and logic cells; and
- a number of output lines coupled to the drain region of the number of thin oxide gate transistors and logic cells.

43. The electronic system of claim 42 wherein at least one of the logic cells is programmed with a fixed charge on the first vertical gate such that the logic cell is effectively removed from the array.

44. The electronic system of claim 42, wherein at least one of the logic cells is programmed with a fixed charge on the second vertical gate such that the logic cell is effectively removed from the array.

45. The electronic system of claim 42 wherein at least one of the logic cells is programmed with a minimal or no fixed charge on either the first vertical gate or the second vertical gate such that the floating gate transistor is effectively included in the array.

46. The electronic system of claim 42, wherein each logic cell includes an electronically alterable and programmable read only memory (EAPROM) cell.

47. The electronic system of claim 42 wherein the first vertical gate and the second vertical gate have a horizontal width of approximately 100 nanometers (nm).

48. The electronic system of claim 42, wherein the first oxide thickness is approximately 60 Angstroms (Å), and wherein the second oxide thickness is approximately 100 Angstroms (Å).

49. The electronic system of claim 42 wherein the first vertical gate separated from a first portion of the channel region by a first oxide thickness includes a first portion of the channel region which is adjacent to the source region, and wherein the second vertical gate separated from a second portion of the channel region by a second oxide thickness includes a second portion of the channel region which is adjacent to the drain region.

50. The electronic system of claim 42, wherein the number of output lines include at least one redundant row line.

51. An electronic system, comprising:
   a memory device;
   a processor coupled to the memory; and
   wherein the memory device includes a memory address decoder including:
      a number of thin oxide gate transistors having a source region, a drain region, and a channel therebetween;
      a number of non volatile memory cells, wherein each non volatile memory cell includes:
         a horizontal substrate, wherein the substrate includes a source region, a drain region, and a channel region separating the source and the drain region;
         a vertical floating gate located above a first portion of the channel region adjacent to the source region and separated from the channel region by a first oxide thickness; and
         a vertical control gate located above a second portion of the channel region adjacent to the drain region and separated from the channel region by a second oxide thickness
      a number of address lines coupled to the gates of the number of thin oxide gate transistors and non volatile memory cells; and
      a number of output lines coupled to the drain region of the number of thin oxide gate transistors and non volatile memory cells.

52. The electronic system of claim 51 wherein the vertical floating gate and the vertical control gate include polysilicon gates which are separated from one another by silicon dioxide ($SiO_2$).

53. The electronic system of claim 51, wherein the vertical floating gate and the vertical control gate each have a horizontal width of approximately 100 nanometers (nm).

54. The electronic system of claim 51, wherein the first oxide thickness is approximately 60 Angstroms (Å), and wherein the second oxide thickness is approximately 100 Angstroms (Å).

55. The electronic system of claim 51, wherein a charge stored on the vertical floating gate located above a first portion of the channel region adjacent to the source region controls electrical conduction between the source regions and the drain regions in the horizontal substrate.

56. The electronic system of claim 51, wherein the processor is coupled to the memory on a single die.

57. The electronic system of claim 51, wherein the at least one redundant row line is coupled to a CMOS inverter, and wherein the CMOS inverter includes a PMOS load transistor and at least one of the non volatile memory cells.

58. The electronic system of claim 51, wherein the number of output lines includes at least one redundant row line, and wherein a charge on the vertical floating gate for at least one of the non volatile memory cells controls the operation of the at least one redundant row line.

59. A method for forming a decode circuit, comprising:
   forming a number of address lines;
   forming a number of output lines;
   forming a number logic cells having gates coupled to the address lines and drain regions coupled to the output lines; and
   forming a number of non volatile memory cells at the intersections of the address lines and at least one output line, wherein forming the number of non volatile memory cells includes:
      forming a source region, a drain region, and a channel region therebetween in a horizontal substrate;
      forming a first vertical gate separated from a first portion of the channel region by a first oxide thickness; and
      forming a second vertical gate separated from a second portion of the channel region by a second oxide thickness, wherein forming the second vertical gate forming the second vertical gate opposing the first vertical gate.

60. The method of claim 59, wherein forming the decode circuit includes forming a NOR decode array.

61. The method of claim 59, wherein forming each second vertical gate in the non volatile memory cells includes interconnecting the second vertical gate with one of the address lines.

62. The method of claim 59, wherein forming a second vertical gate separated from a second portion of the channel region by a second oxide thickness includes forming the second vertical gate above a second portion of the channel region adjacent to the drain region.

63. The method of claim 59, wherein forming each first vertical gate includes forming a floating gate and forming the second vertical gate includes forming a control gate.

64. The method of claim 59, wherein forming each first vertical gate includes forming a control gate and forming the second vertical gate includes forming a floating gate.

65. The method of claim 59, wherein forming the first vertical gate separated from a first portion of the channel region by a first oxide thickness includes a forming the first vertical gate above a first portion of the channel region which is adjacent to the source region.

66. The method of claim 59, wherein forming the first vertical gate includes forming the first vertical gate such that a charge stored on the first vertical gate controls conduction in the horizontal channel region.

67. A method for forming a memory address decoder, comprising:
   forming a number of thin oxide gate transistors having a source region, a drain region, and a channel therebetween;
   forming a number of non volatile memory cells, wherein forming the non-volatile memory cells includes:
      forming a source region, a drain region, and a channel region therebetween in a horizontal substrate;
      forming a first vertical gate located above a first portion of the channel region and separated from the channel region by a first oxide thickness;
      forming a second vertical gate located above a second portion of the channel region and separated from the channel region by a second oxide thickness, and
      forming a third vertical gate located above a third portion of the channel region and separated from the channel region by the second oxide thickness;
   forming a number of address lines coupled to the gates of the number of thin oxide gate transistors and non volatile memory cells; and forming a number of output lines coupled to the drain region of the number of thin oxide gate transistors and non volatile memory cells.

68. The method of claim 67, wherein forming the second and the third vertical gates includes forming the second and the third vertical gates on opposing sides of the first vertical gate.

69. The method of claim 67, wherein the forming the first vertical gate includes forming a floating gate and wherein forming the second and the third vertical gates includes forming control gates.

70. The method of claim 67, wherein forming the first vertical gate includes forming a control gate and wherein forming the second and the third vertical gates includes forming floating gates.

71. The method of claim 67, wherein forming each non-volatile memory cell further includes forming a horizontal gate member which couples the second and the third vertical gates.

72. The method of claim 67, wherein forming each non-volatile memory cell further includes forming each non-volatile memory cell such that a greater percentage of a voltage applied to the second and the third vertical gates appears between the first vertical gate and the channel than between the first vertical gate and the second and the third vertical gates.

73. The method of claim 67, wherein forming the first, second and the third vertical gates includes forming the first, second and the third vertical gates to each have a horizontal width of approximately 100 nanometers (nm).

74. The method of claim 67, wherein forming the first vertical gate separated from the channel region by a first oxide thickness includes separating the first vertical gate from the channel region by a first oxide thickness which is approximately 60 Angstroms (Å) and wherein forming the second and the third vertical gates separated from the channel region by a second oxide thickness includes separating the second vertical gate from the channel region by a second oxide thickness which is approximately 100 Angstroms (Å).

75. The method of claim 67, wherein forming the number of thin oxide gate transistors includes forming a number of floating gate transistors which are selectively coupled to the number of address lines.

76. The method of claim 67, wherein forming the memory address decoder includes forming a number of CMOS inverters coupled to the number of output lines.

77. The method of claim 67, wherein forming the number of output lines includes forming at least one redundant row line.

78. The method of claim 77, wherein the method further includes coupling the drain region for the number of non volatile memory cells to the at least one redundant row line.

79. A method for enabling error correction in a decode circuit, having a number of non volatile vertical floating gate transistors coupled to a redundant row line, comprising:
selectively applying a first potential across a first thickness oxide between a vertical floating gate and a first portion of a horizontal substrate, the horizontal substrate including a source region and a drain region separated by a horizontal channel region, in order to add or remove a charge from the vertical floating gate; and
enabling the redundant row line by applying a second potential to a vertical control gate located above a second portion of the horizontal substrate, wherein the vertical control gate is parallel to and opposing the vertical floating gate.

80. The method of claim 79, wherein selectively applying a first potential across a first thickness oxide includes selectively applying a first potential of less than 5 Volts.

81. The method of claim 79, wherein enabling the redundant row line by applying a second potential includes applying a second potential of approximately 2 Volts.

82. The method of claim 79, wherein enabling the redundant row line by applying a second potential to the vertical control gate includes enabling the redundant row when a minimal or no charge is present on the vertical floating gate.

83. The method of claim 79, wherein selectively applying a first potential across a first thickness oxide between a vertical floating gate and a first portion of a horizontal substrate in order to add or remove a charge from the vertical floating gate includes controlling conduction in the horizontal channel.

84. A method for enabling error correction in a decode circuit, having a number of non volatile vertical floating gate transistors coupled to a redundant row line, comprising:
selectively storing a limited charge on a vertical floating gate above a horizontal channel region in the number of non volatile floating gate transistors, wherein selectively storing the limited charge on the vertical floating gate controls addressing the redundant row line; and
applying a potential to a vertical control gate opposing the vertical floating gate and above the horizontal channel using a number of address lines.

85. The method of claim 84, wherein applying a potential to a vertical control gate opposing the vertical floating gate includes applying a potential of approximately 2 Volts.

86. The method of claim 84, wherein selectively storing a limited charge on a vertical floating gate above a horizontal channel region in the number of non volatile floating gate transistors further includes programming the vertical floating by applying a potential of less than 5 Volts to the vertical control gate.

87. The method of claim 86, wherein applying a potential of less than 5 Volts to the vertical control is such that a greater percentage of the applied potential appears between the vertical floating gate and the horizontal channel than between the vertical floating gate and the vertical control gate.

88. The method of claim 84, wherein selectively storing a limited charge on a vertical floating gate above a horizontal channel region includes selectively storing a limited charge on a vertical floating gate separated by a first oxide thickness from the horizontal channel.

89. The method of claim 88, wherein applying a potential to a vertical control gate opposing the vertical floating gate and above the horizontal channel includes applying the potential to a vertical control gate separated by a second oxide thickness from the horizontal channel.

90. The method of claim 89, wherein applying the potential to the vertical control gate separated by the second oxide thickness includes applying the potential to the vertical control gate separated by an oxide thickness which is greater than the first oxide thickness.

91. The method of claim 84, wherein the method further includes selectively removing a limited charge from a vertical floating gate above a horizontal channel region in the number of non volatile floating gate transistors.

92. The method of claim 84, wherein selectively storing a limited charge on a vertical floating gate above a horizontal channel region in the number of non volatile floating gate transistors includes disabling the non volatile floating gate transistor in the decode circuit.

* * * * *